(12) United States Patent
Choyikkunnil et al.

(10) Patent No.: US 10,455,715 B2
(45) Date of Patent: Oct. 22, 2019

(54) ADJUSTABLE CARRIER

(71) Applicant: Seagate Technology LLC, Cupertino, CA (US)

(72) Inventors: Anil Koyad Choyikkunnil, Bangalore (IN); Kiran Padmakumari Devapalan, Bangalore (IN); Shankar Gopalakrishna, Bangalore (IN); Saju Cheeran Verghese Francis, Bangalore (IN)

(73) Assignee: Seagate Technology LLC, Cupertino, CA (US)

( * ) Notice: Subject to any disclaimer, the term of this patent is extended or adjusted under 35 U.S.C. 154(b) by 42 days.

(21) Appl. No.: 15/829,298

(22) Filed: Dec. 1, 2017

(65) Prior Publication Data

US 2019/0174642 A1 Jun. 6, 2019

(51) Int. Cl.
*H05K 5/02* (2006.01)
*H05K 5/00* (2006.01)
*H05K 7/14* (2006.01)
*G11B 33/12* (2006.01)
*G11B 33/02* (2006.01)

(52) U.S. Cl.
CPC ......... *H05K 5/0217* (2013.01); *G11B 33/124* (2013.01); *H05K 5/0004* (2013.01); *H05K 7/1487* (2013.01); *G11B 33/022* (2013.01)

(58) Field of Classification Search
CPC .. H05K 13/0486; H05K 5/0217; H05K 5/004; H05K 7/1487; H05K 5/0004; G11B 33/124

See application file for complete search history.

(56) References Cited

U.S. PATENT DOCUMENTS

| | | |
|---|---|---|
| 7,251,132 B1 | 7/2007 | Paul et al. |
| 7,515,410 B1 | 4/2009 | Dingfelder et al. |
| 8,286,922 B2 | 10/2012 | Chou et al. |
| 8,406,003 B2 | 3/2013 | Zhang et al. |
| 8,456,832 B1 | 6/2013 | Brigham, Jr. et al. |
| 8,462,495 B1 | 6/2013 | Keefe et al. |
| 8,508,928 B2 | 8/2013 | Killen et al. |
| 8,817,460 B2 | 8/2014 | Yu et al. |
| 9,420,718 B2 | 8/2016 | Du et al. |

(Continued)

OTHER PUBLICATIONS

U.S. Appl. No. 15/356,920, filed Nov. 21, 2016, Seagate Technology LLC.

(Continued)

*Primary Examiner* — Dimary S Lopez Cruz
*Assistant Examiner* — Ingrid D Wright
(74) *Attorney, Agent, or Firm* — Mueting, Raasch & Gebhardt, P.A.

(57) ABSTRACT

Carriers may be adapted, or configured, to secure one of a plurality of varying-sized devices received thereby. Regardless of the size of the device, an interface of the device may be positioned proximate an interface opening of the carrier for, for example, operable coupling to an enclosure. The carrier may include a first side rail, a second side rail, and a movable rail that moves between the first and second side rail to adapt, or configure, the carrier to secure the one of the plurality of varying-sized devices received thereby. For example, the movable rail may be linearly translatable between the first and second side rails.

17 Claims, 21 Drawing Sheets

(56) References Cited

U.S. PATENT DOCUMENTS

| | | |
|---|---|---|
| 9,625,960 B1 | 4/2017 | Ent et al. |
| 9,691,435 B2 | 6/2017 | Ehlen |
| 9,746,887 B2 | 8/2017 | Lai |
| 2012/0147545 A1 | 6/2012 | Niu et al. |
| 2012/0300384 A1 | 11/2012 | Alo et al. |
| 2013/0058033 A1 | 3/2013 | Hu et al. |
| 2013/0277513 A1 | 10/2013 | Pan et al. |
| 2016/0293223 A1 | 10/2016 | Ehlen |
| 2017/0018293 A1 | 1/2017 | Chen et al. |
| 2017/0147042 A1 | 5/2017 | Liu et al. |
| 2018/0137895 A1* | 5/2018 | Charpiot ................ G06F 1/187 |

OTHER PUBLICATIONS

U.S. Appl. No. 15/824,816, filed Nov. 28, 2017, Seagate Technology LLC.

* cited by examiner

ADJUSTABLE CARRIER

The disclosure herein relates to movement and adaptation of a carrier for receiving various different-sized devices, and further to systems and methods for providing such adaptation and movement.

SUMMARY

An illustrative carrier may include a first side rail and a second side rail spaced apart from the first side rail. Each of the first and second side rails may extend between a forward end region and an interface end region. The carrier may also include a movable rail extending between a forward end region and an interface end region. The movable rail may be linearly translatable between the first and second side rails to receive one of a plurality of varying-width devices between the movable rail and the second side rail.

An illustrative apparatus may include a first side rail, a second side rail, and a movable rail. Each of the first side rail, the second side rail, and the movable rail may extend between a forward end region and an interface end region. The movable rail may be positioned between the first and second side rails and may be movable between an expanded configuration to receive a first device and a reduced configuration to receive a second device that is different than the first device. The movable rail may define an outer surface facing the first side rail and an opposite inner surface facing the second side rail in both the expanded and reduced configurations. An expanded distance measured between the inner surface of the movable rail and the second side rail when the movable rail is in the expanded configuration may be greater than a reduced distance measured between the inner surface of the movable rail and the second side rail when the movable rail is in the reduced configuration.

An illustrative system is described herein. The system may include one of a first device and a second device. The first device may define a first width between a first edge and a second edge, and the second device may define a second width between a first edge and a second edge that is less than the first width. The carrier system may include a first side rail, a second side rail, and a movable rail. Each of the first side rail, the second side rail, and the movable rail may extend between a forward end region and an interface end region. The movable rail may be positioned between the first and second side rails. The movable rail may define an outer surface facing the first side rail and an opposite inner surface facing the second side rail. The movable rail may be movable between an expanded configuration defining an expanded opening to receive the first device such that the inner surface of the movable rail abuts the first edge of the first device and a reduced configuration defining a reduced opening to receive the second device such that the inner surface of the movable rail abuts the first edge of the second device.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
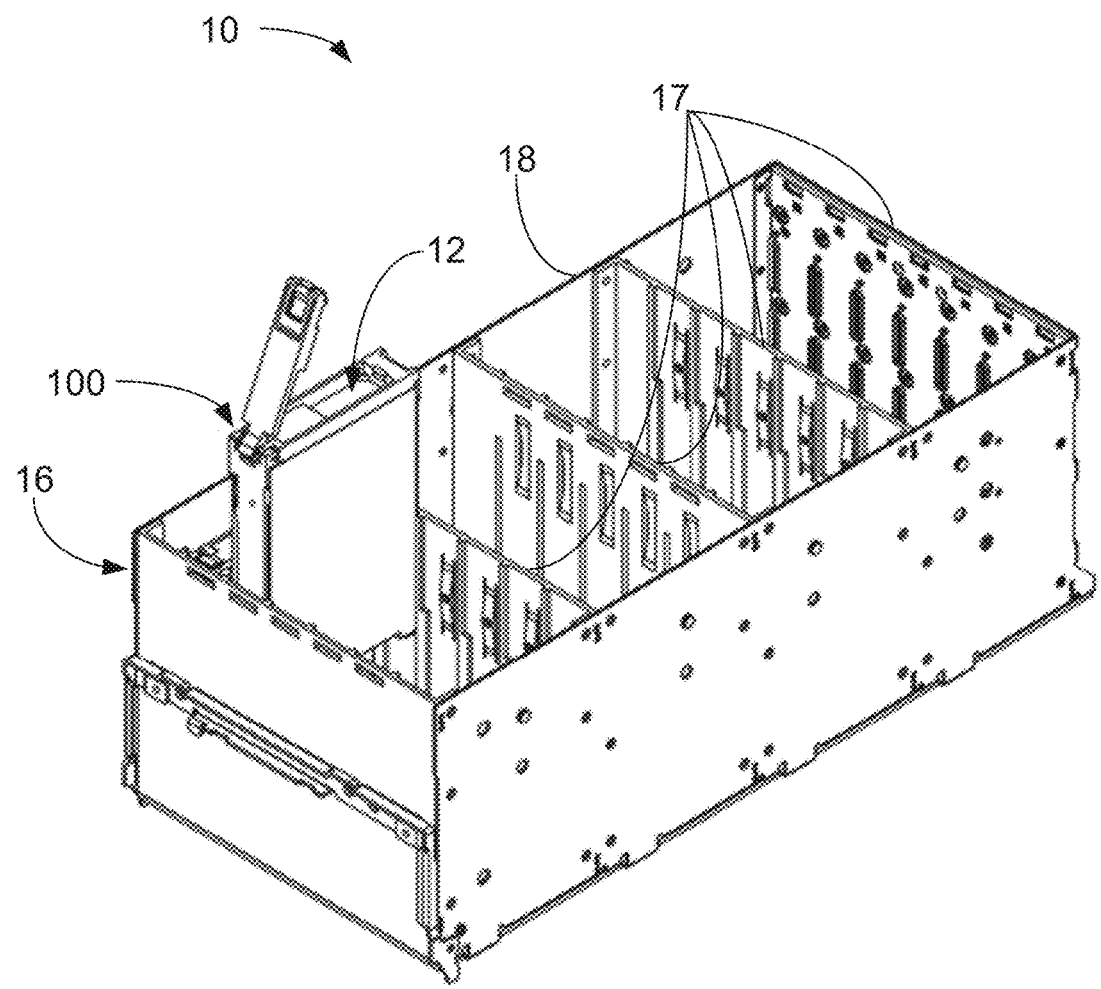
FIG. 1 is a perspective view of an enclosure system including a receiving frame and a device captured by an illustrative carrier.

Exemplary systems, carriers, and carrier apparatus shall be described with reference to FIGS. 1-8. It will be apparent to one skilled in the art that elements or processes from one embodiment may be used in combination with elements or processes of the other embodiments, and that the possible embodiments of such systems, carriers, and carrier apparatus using combinations of features set forth herein is not limited to the specific embodiments shown in the figures and/or described herein. Further, it will be recognized that the size and shape of various elements herein may be modified but still fall within the scope of the present disclosure, although certain one or more shapes and/or sizes, or types of elements, may be advantageous over others.

The present disclosure relates to adaptable carriers that receive devices. The carriers may be received by enclosures such that the devices contained within the carriers may interface with one or more circuit boards of the enclosure. The devices may include any device that may be received by and carried by the carriers. In one or more embodiments, the devices are data storage drives, which may include any device and/or apparatus configured to store data (e.g., binary data, etc.). The data storage drives may include one or more storage mediums that can include, but is not necessarily limited to, solid state memory, hard magnetic discs, magnetic tapes, optical discs, integrated circuits, volatile memory, nonvolatile memory, and any combination thereof. In one or more embodiments, the devices may be computing devices such as e.g., file servers, storage servers, NAS servers, cold storage, workstations, etc.

The enclosures may be used to removably, physically, and operably couple each of devices contained within the carriers to other computer apparatus such as, a storage area network or other computing system that provides an information technology service. In such cases, the carriers may be mounted within an enclosure, such as a rack enclosure, or otherwise mounted to a larger structure during use. Such an enclosure may include a circuit board, such as a midplane or baseplane, that electrically, optically, or otherwise operably connects to the devices, for example, to transfer information and/or power.

Devices can be defined by standards that specify or control the geometry of the device. For example, the small form factor (SFF) and large form factor (LFF) definitions control the mounting hole locations, connector location, and maximum dimensions for base casting. Further, a SFF device may include 2.5-inch data storage devices and an LFF device may include 3.5-inch data storage devices. Except for this geometry, the other exterior features and dimensions of an SFF device or LFF device may be uniquely configured, such as the height of the device. A carrier can be used to capture the unique geometry of a device to facilitate mounting to a particular type of enclosure. When captured by a carrier, the device may then be securely mounted to the enclosure via the carrier and operably connected to the circuit board of the enclosure. The devices may include an interface to be operably coupled, or connected, to the circuit board or another equivalent structure of the enclosure.

Exemplary carriers described herein may be configurable to receive devices to position the interfaces of the devices to be operably coupled, or connected, to the corresponding interface of the enclosure when the carriers are received thereby. Further, regardless of the size of the device, or configuration of the carrier, the interface of the device may be located in the same location relative to the carrier. In this way, a single type of carrier can be used for devices of varying sizes. Further, the exemplary carriers and portions thereof may be used to capture devices without the use of additional tools (such as, e.g., screws, screwdrivers, and the equivalents thereof).

The exemplary toolless carrier may be described as being able to support a device (e.g., hard disk drive) of varying sizes (e.g., varying widths). In an expanded configuration or position, the carrier may be sized to receive, e.g., a LFF device, such that the device may be appropriately positioned proximate an interface region of the carrier and the interface of the device may be coupled to a network or data interface topology of a system (e.g., enclosure). In a reduced configuration or position, the carrier may be sized to receive, e.g., a SFF device, such that the device may be appropriately positioned proximate an interface region of the carrier and the interface of the device may be coupled to a network or data interface topology of a system (e.g., enclosure).

The exemplary carriers and systems may be described as providing ease of service because, e.g., a user may only need a single carrier to accommodate various sized devices without the use of tools. For example, carrier may be adjusted or modified to accommodate the various sized devices only by hand modifications of a user (e.g., by moving or shifting or rotating components of the adjustable carrier). Further, the adjustable carrier does not include or require any loose components (e.g., components that are not attached or connected to the carrier) to make such modifications to the carrier. By using a carrier that can be modified in a toolless way, the carrier may, e.g., reduce assembly time, reduce inventory cost, remove the need for tools to modify the carrier, remove the need for loose parts that may become lost or need replacement, etc. In other words, the carrier may be field replaceable or modified.

The following terms used throughout the present disclosure are defined as follows, unless the context of the disclosure dictates otherwise:

As used herein, "capture" means to attach to a device for purposes of mechanical mounting to another structure. For example, a device may be captured by attaching a carrier to it. The carrier may be used to mount the device to an enclosure.

As used herein, "mount" means to attach to a structure for operational use. For example, a device may be mounted to an enclosure by attaching the device to a receiving frame of the enclosure and optionally connecting the device to a circuit board of the enclosure such that the device is installed in the enclosure.

As used herein, "secure" means to restrict the movement of a component relative to another component suitably for a particular application. For example, a carrier may secure the device by disposing the device between two side rails (e.g., including a movable rail), a forward portion, and an interface portion of the carrier to restrict movement of the device relative to the carrier for purposes of mechanical mounting to an enclosure.

As used herein, "engage" means to interface, touch, or directly contact to accomplish a particular task. For example, a slider apparatus may engage the forward portion to secure the slider apparatus into position.

The terms "coupled" or "connected" refer to elements being attached to each other either directly (in direct contact with each other) or indirectly (having one or more elements between and attaching the two elements).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference will now be made to the drawings, which depict one or more aspects described in this disclosure. However, it will be understood that other aspects not depicted in the drawings fall within the scope and spirit of this disclosure. Like numbers used in the figures refer to like components, elements, portions, regions, openings, apertures, and the like. However, it will be understood that the use of a reference character to refer to an element in a given figure is not intended to limit the element in another figure labeled with the same reference character.

FIG. 1 shows an enclosure system 10 according to one or more embodiments. As illustrated, the enclosure system 10 includes a device 12 (e.g., a data storage device, a computing device, an electronic device, etc.) captured in a carrier 100 in the process of being mounted into or unmounted from an enclosure 16. The enclosure 16 may include a receiving frame 18 and a circuit board or similar circuitry located at the bottom or back of the receiving frame 18 as depicted in FIG. 1. Although not shown, the enclosure 16 may include a shroud to cover the receiving frame 18 and any mounted carriers 100.

The enclosure 16 may be configured to receive one or more carriers 100 carrying, or holding, devices 12. In some embodiments, the enclosure 16 defines one or more arrays of carriers 100 (e.g., multiple rows). Although as illustrated, only one carrier 100 is shown for illustrative purposes, the carriers 100 may be arranged in any suitable manner. In some embodiments, the carriers 100 are in a "tombstone" arrangement, in which the carriers 100 are inserted lengthwise into the receiving frame 18 of the enclosure 16. The carriers 100 may be stacked height-wise into rows. Each row of carriers 100 may be as wide as the carriers 100 therein. In one or more embodiments, the rows of carriers 100 may be stacked.

Each carrier 100 may be mounted adjacent to one or more sidewalls 17 of the receiving frame 18. The sidewalls 17 may be engaged by the carriers 100 to secure the captured devices 12 to the enclosure 16. One or more sidewalls 17 may also separate the rows of carriers 100 within the enclosure 16.

A user may position or at least partially dispose the carriers 100 within the receiving frame 18 until the carriers 100 are mounted to the enclosure 16. In one or more embodiments, it may be described that the carriers 100 are configured to allow the user to control the mounting process by handling the carriers 100 as opposed to the devices 12 contained therein.

After being positioned in the enclosure 16, a user may secure the carriers 100 to the receiving frame 18 to complete the mounting process. In one or more embodiments, the carriers 100 are configured to allow the user to lock the carriers 100 to the receiving frame 18. Securing the carriers 100 to the receiving frame 18 may also to establish a connection or operable coupling from the devices 12 to a circuit board of the enclosure 16. In one or more embodiments, the devices 12 are operably connected to a circuit board such as e.g., a midplane, when mounted, for example, to transfer data and/or power. Such a connection may be electrical, optical, electromagnetic, or any other suitable type of connection.

More specifically, each of the devices 12 may include a device interface that is configured to be operably coupled to an interface of the enclosure 16. The carriers 100 may be configured to house the devices 12, and when coupled to the enclosure 16, facilitate the operable functional coupling of the device interfaces of the devices 100 to the interfaces of the enclosure 16. The exemplary carriers 100 described herein may be configured to position the device interface of the devices 12 (e.g., regardless of the size of the device) contained therein so as to be operably coupled to the interfaces of the enclosure 16 when the carriers 100 are received by the enclosure 16.

An exemplary carrier 100 configured to capture a device 12 such as, e.g., computing devices, data storage devices, etc. is depicted in more detail in FIGS. 2-8. When securely captured, the device 12 may be at least partially disposed within the carrier 100. In some embodiments, the carrier 100 may engage two sides of the device 12. In one or more embodiments, the carrier 100 may engage more than two sides of the device 12.

As shown, the carrier 100 may extend from a forward region end region 102 to an interface end region 104 along a carrier axis 101. The forward end region 102 may be positioned, or located, on a front side of an enclosure 16 when the carrier 100 is positioned therein. The interface end region 104, which may be described as being opposite the forward end region 102, may be inserted in the enclosure 16 when the carrier 100 is positioned therein.

The carrier 100 may include a first side rail 110 and a second side rail 120 spaced apart from the first side rail 110 such that a device 12 may be positioned therebetween and securely coupled to the carrier 100 (e.g., as shown in FIGS. 2-3). As will be further described herein, the carrier 100 may be configured to toollessly couple the device 12 therein. It is noted that the device 12 may refer to a first device 20 (e.g., as shown in FIGS. 2A-2E) or a second device 30 (e.g., as shown in FIGS. 3A-3E) that is a different size than the first device 20. The first side rail 110 may be described as extending between a forward end region (or portion) 112 and an interface end region 114 (or portion). Similarly, the second side rail 120 may be described as extending between a forward end region (or portion) 122 and an interface end region (or portion) 124. Each of the first and second side rails 110, 120 may be described as extending in a direction parallel to the carrier axis 101.

The carrier 100 may further include a forward portion 140 proximate the forward end region 102 of the carrier 100 and extending between a first end region (or portion) 142 and a second end region (or portion) 144. Also, the carrier 100 may include an interface portion 150 proximate the interface end region 104 of the carrier and extending between a first end region (or portion) 152 and a second end region (or portion) 154. As shown in FIGS. 2B and 3B, the carrier 100 may also include a back portion 107 that extends between the forward portion 140, the interface portion 150, and the first side rail 110 to, e.g., help support the device 12 that is received by the carrier 100.

The first side rail 110, second side rail 120, the forward portion 140, and the interface portion 150 may combine to surround and enclose the device 12 on four sides. For example, it may be described that each of the first and second side rails 110, 120, the forward portion 140, and the interface portion 150 may define a carrier frame that defines an interior space, within which the device 12 may be positioned.

Further, the first and second side rails 110, 120 may be connected to the forward and interface portions 140, 150 in a variety of different ways to, e.g., secure the device 12 contained therein. For example, the first end region 142 of the forward portion 140 may be connected to the forward end region 112 of the first side rail 110 and the second end region 144 of the forward portion 140 may be connected to the forward end region 122 of the second side rail 120. Further, for example, the first end region 152 of the interface portion 150 may be connected to the interface end region 114 of the first side rail 110 and the second end region 154 of the interface portion 150 may be connected to the interface end region 124 of the second side rail 120. As described herein, connected may include, e.g., removably connected, pivotally connected, fixedly coupled, etc.

Figure 8A:
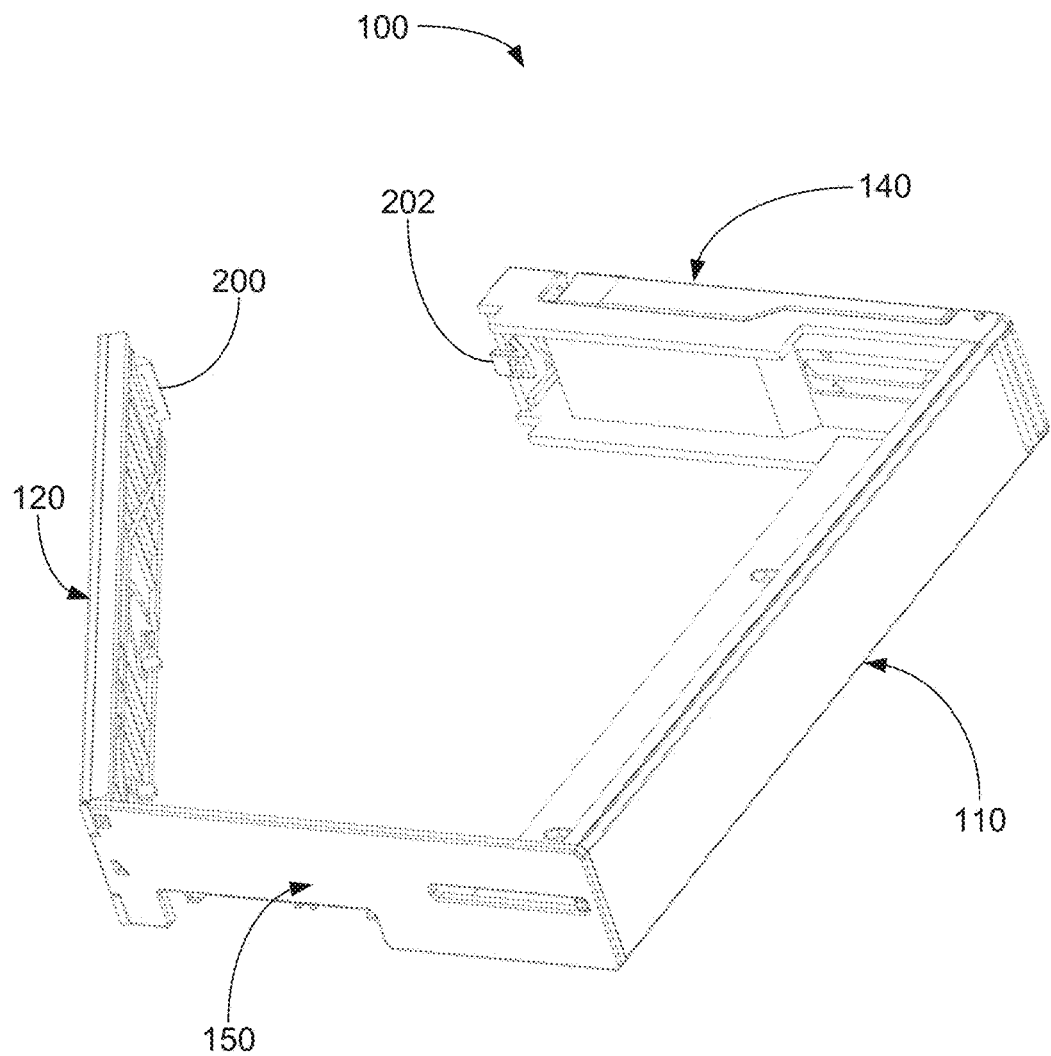
FIG. 8A is a top perspective of another illustrative carrier with a second side rail in a partially open position.
Figure 8B:
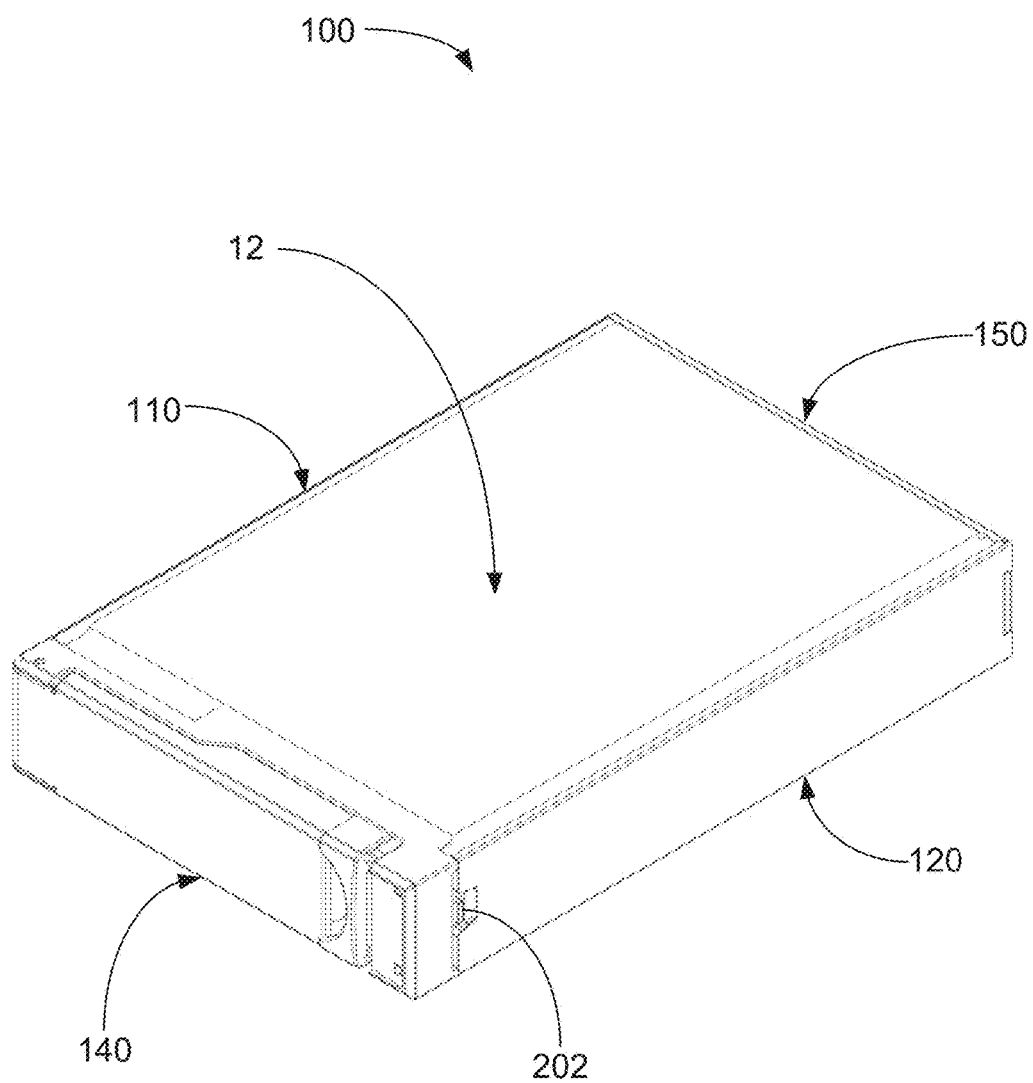
FIG. 8B is a top perspective of the carrier of FIG. 8A with the second side rail in a closed position.

Each of the first and second side rails 110, 120, the forward portion 140, and the interface portion 150 may be removably coupled to each so as to be able to be wrapped around the device 12 to secure the device therein 12. For example, as shown in FIGS. 8A-8B, the second side rail 120 may be removably couplable to the forward portion 140 and may be pivotally couplable to the interface portion 150. As such, second side rail 120 may be pivoted about the interface portion 150 to provide an opening to insert the device 12 into the carrier 100 (e.g., between the forward and interface portions 140, 150 and towards the first side rail 110 or movable rail 130). Specifically, the second side rail 120 may be pivoted between a closed position (e.g., as shown in FIG. 8B) to secure the device 12 within the carrier 100, a partially open position (e.g., as shown in FIG. 8A), and an open position (not shown) to provide access to insert the device 12 within the carrier 100. The second side rail 120 may be pivoted such that the second side rail 120 is parallel with the interface portion 150 or past parallel with the interface portion 150 (e.g., pivoted greater than 90 degrees) to ensure that the second side rail 120 does not interfere with insertion of the device 12 within the carrier 100. After the device 12 is inserted into the carrier 100, the second side rail 120 may be pivoted to enclose the device 12 and connect or couple (e.g., using a snap feature) with the forward portion 140.

The second side rail 120 may be removably couplable to the forward portion 140 in any suitable way. For example, as shown in FIG. 8A, the second side rail 120 may include a receiving member 200 and the forward portion 140 may include a latching member 202. The latching member 202 of the forward portion 140 may engage the receiving member 200 of the second side rail 120 to removably couple the forward portion 140 to the second side rail 120 and, e.g., restrict movement between the second side rail 120 and the forward portion 140. For example, the latching member 202 may include a cantilever latch and the receiving member 200 may include a loop. The cantilever latch may include a protrusion that is biased to engage (e.g., locks or snaps) into an opening defined by the loop (e.g., when coming in contact with one another) to restrict movement between the second side rail 120 and the forward portion 140. As shown in FIG. 8B, the latching member 202 may be visible and accessible on an outside of the carrier 100 (e.g., between the forward portion 140 and the second side rail 120). A user may actuate the latching member 202 to apply a force on the latching member 202 such that the second side rail 120 is uncoupled from the forward portion 140 (e.g., by disengaging the latching member 202 and the receiving member 200) and the second side rail 120 can pivot about the interface portion 150 (e.g., to allow a device 12 to be inserted within the carrier 100).

Figure 2A:
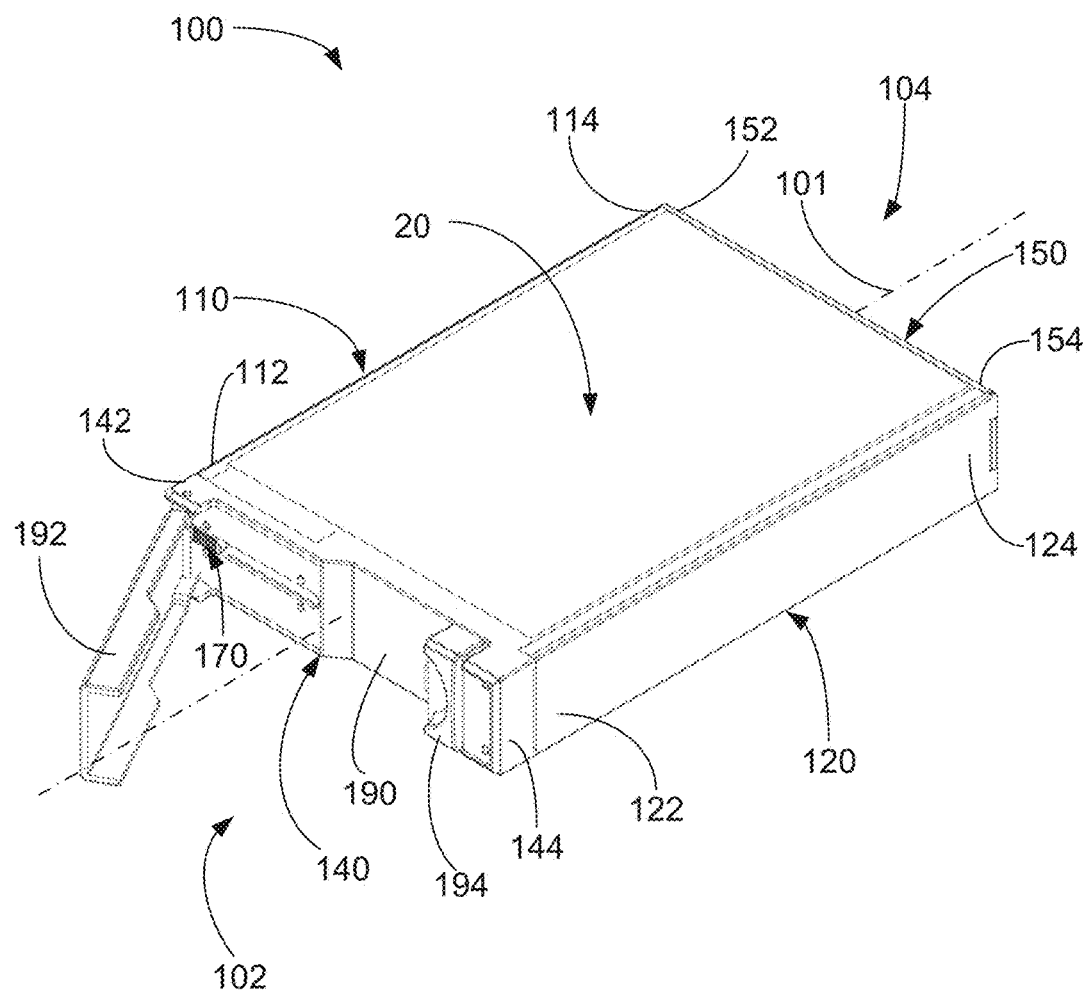
FIG. 2A is a top perspective of an illustrative carrier configured in an expanded configuration and a first device received thereby.
Figure 2B:
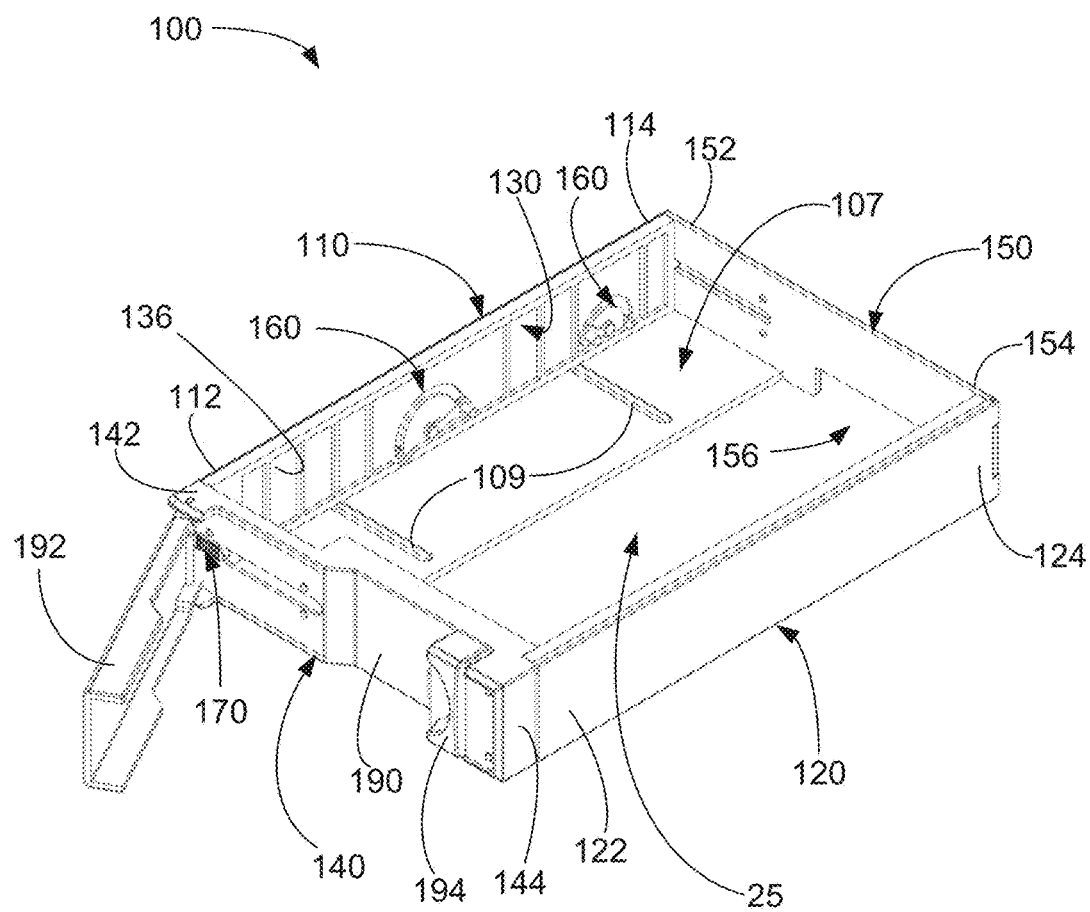
FIG. 2B is a top perspective of the carrier of FIG. 2A configured in the expanded configuration without the first device received thereby.
Figure 2C:
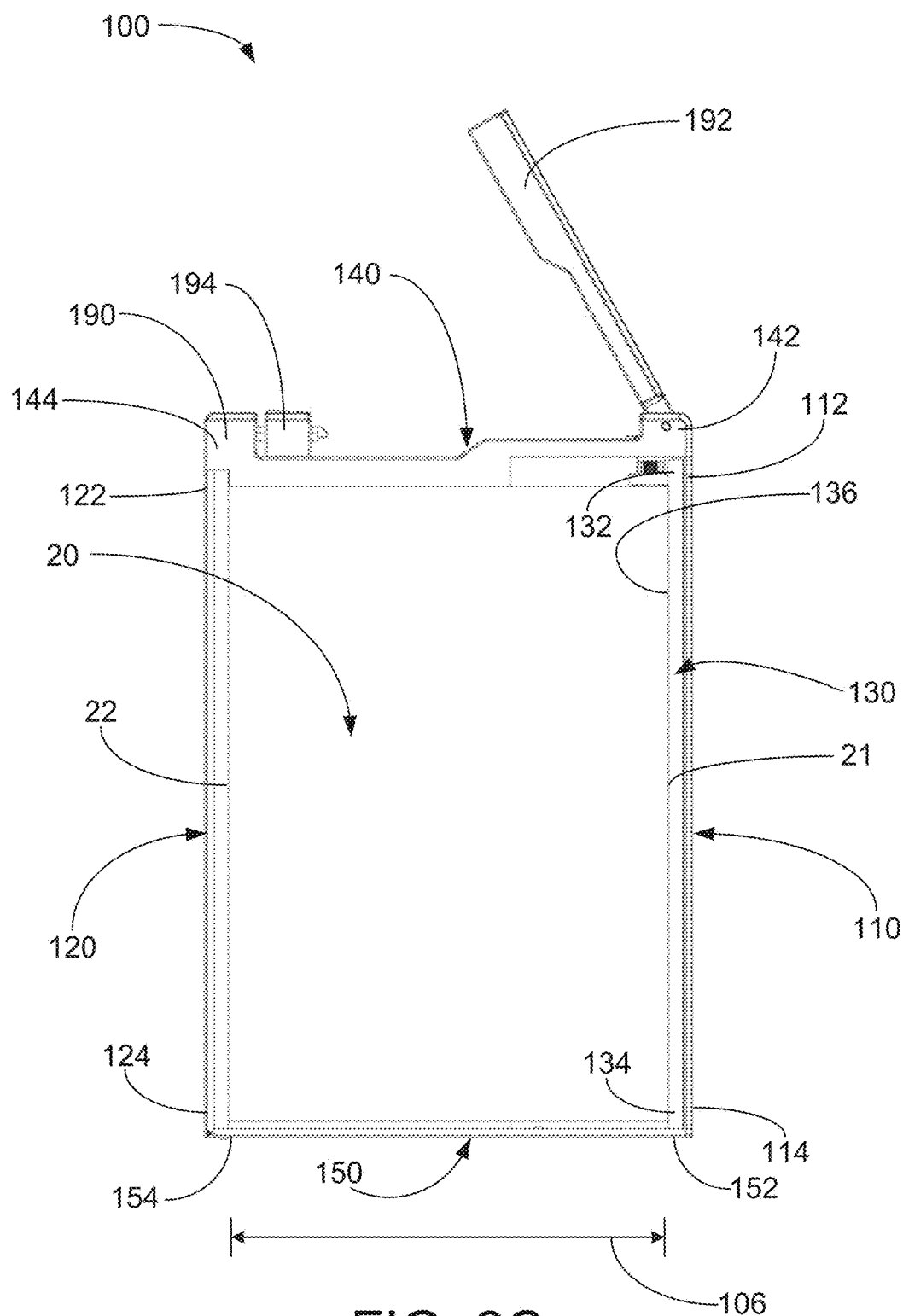
FIG. 2C is a top view of the carrier of FIG. 2A configured in the expanded configuration and the first device received thereby.
Figure 2D:
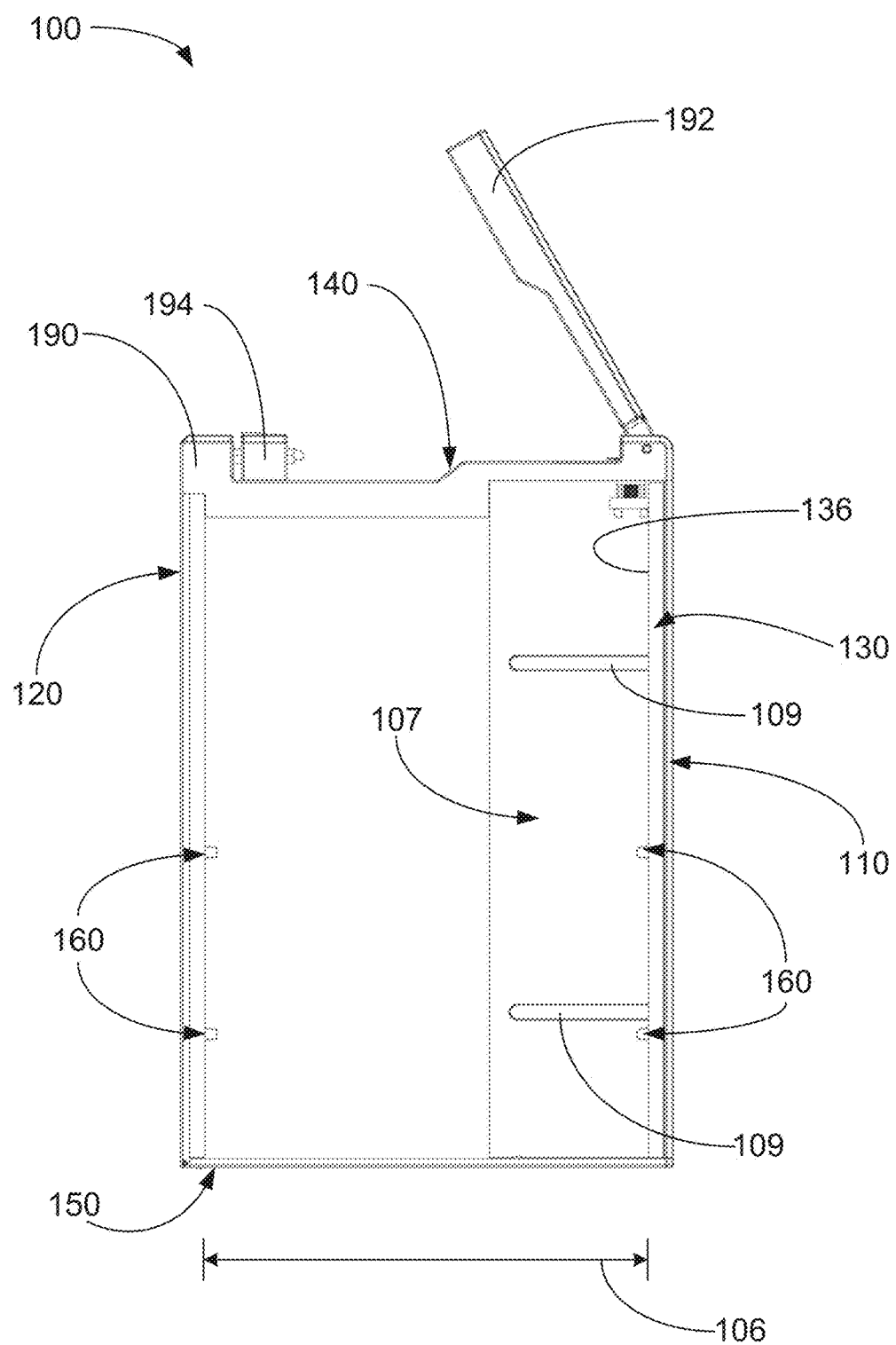
FIG. 2D is a top view of the carrier of FIG. 2A configured in the expanded configuration without the first device received thereby.
Figure 2E:
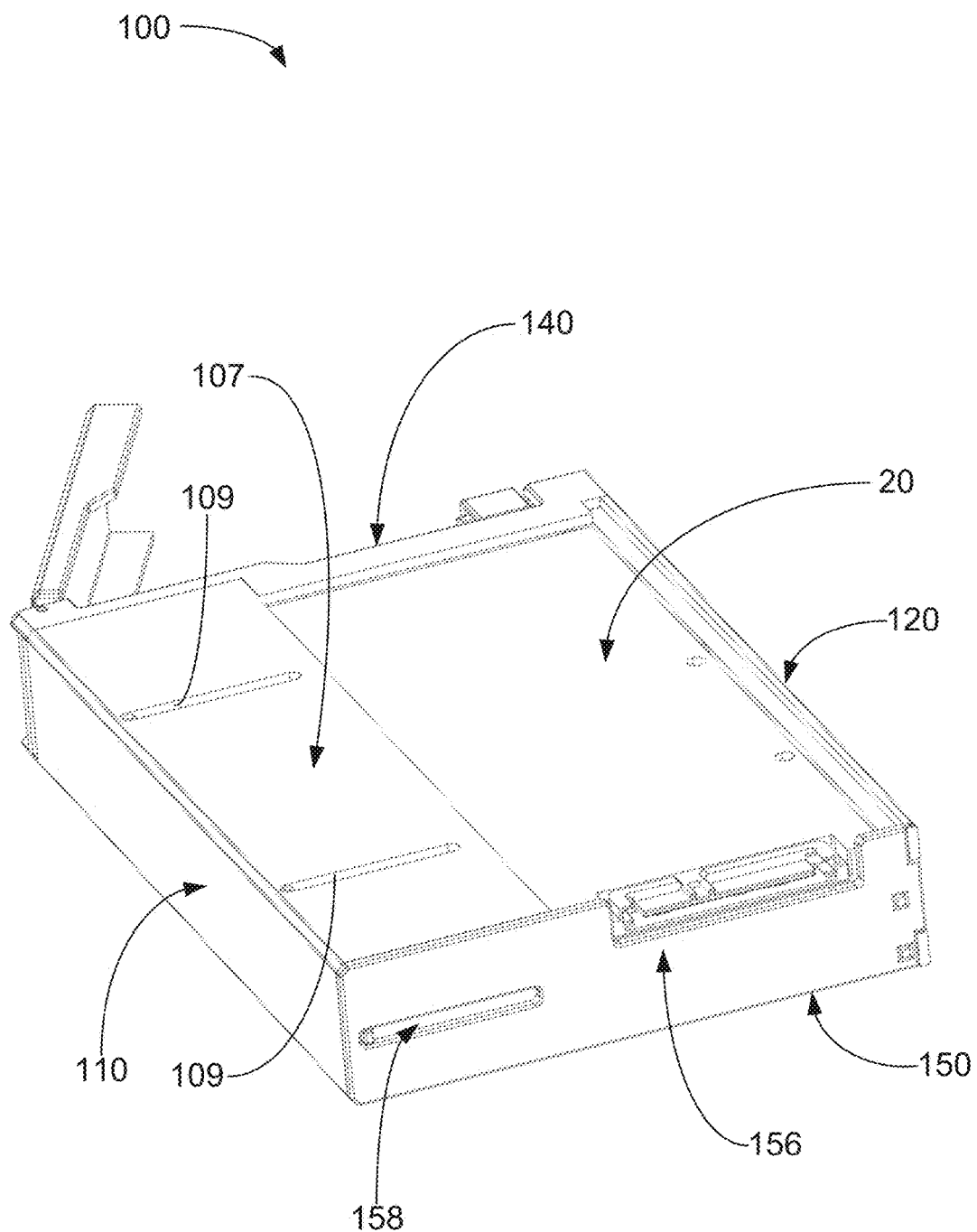
FIG. 2E is a bottom perspective view of the carrier of FIG. 2A configured in the expanded configuration and the first device received thereby.
Figure 3A:
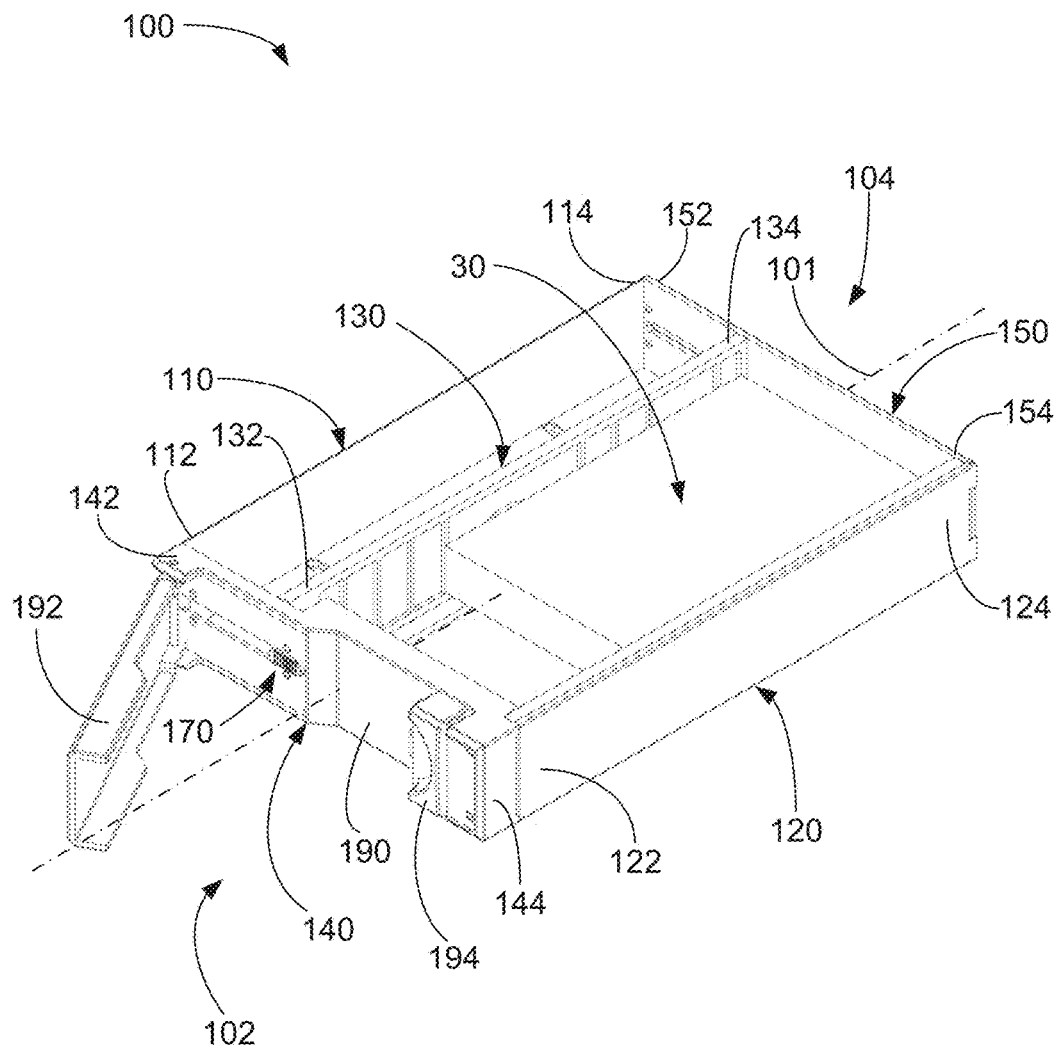
FIG. 3A is a top perspective of an illustrative carrier configured in a reduced configuration and a second device received thereby.
Figure 3B:
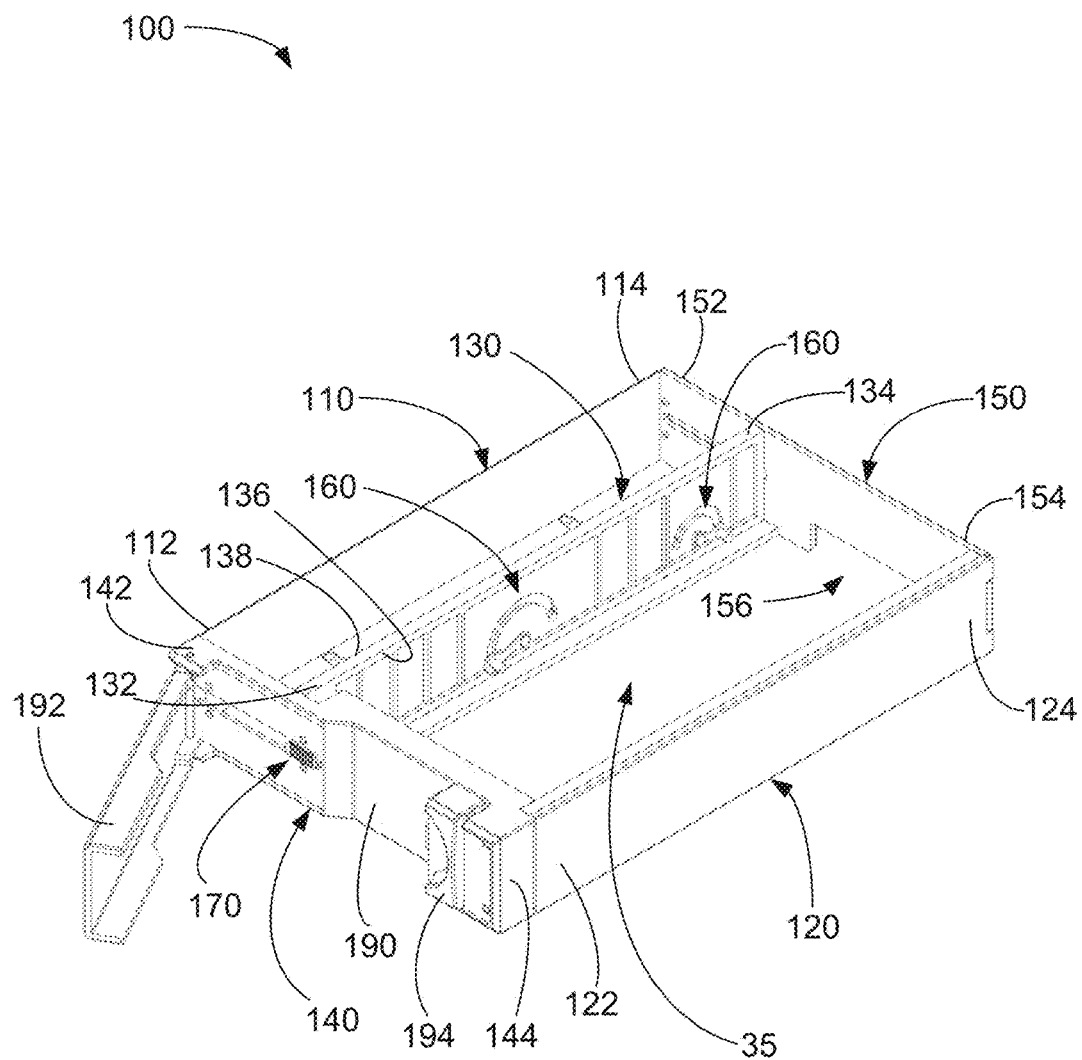
FIG. 3B is a top perspective of the carrier of FIG. 3A configured in the reduced configuration without the second device received thereby.
Figure 3C:
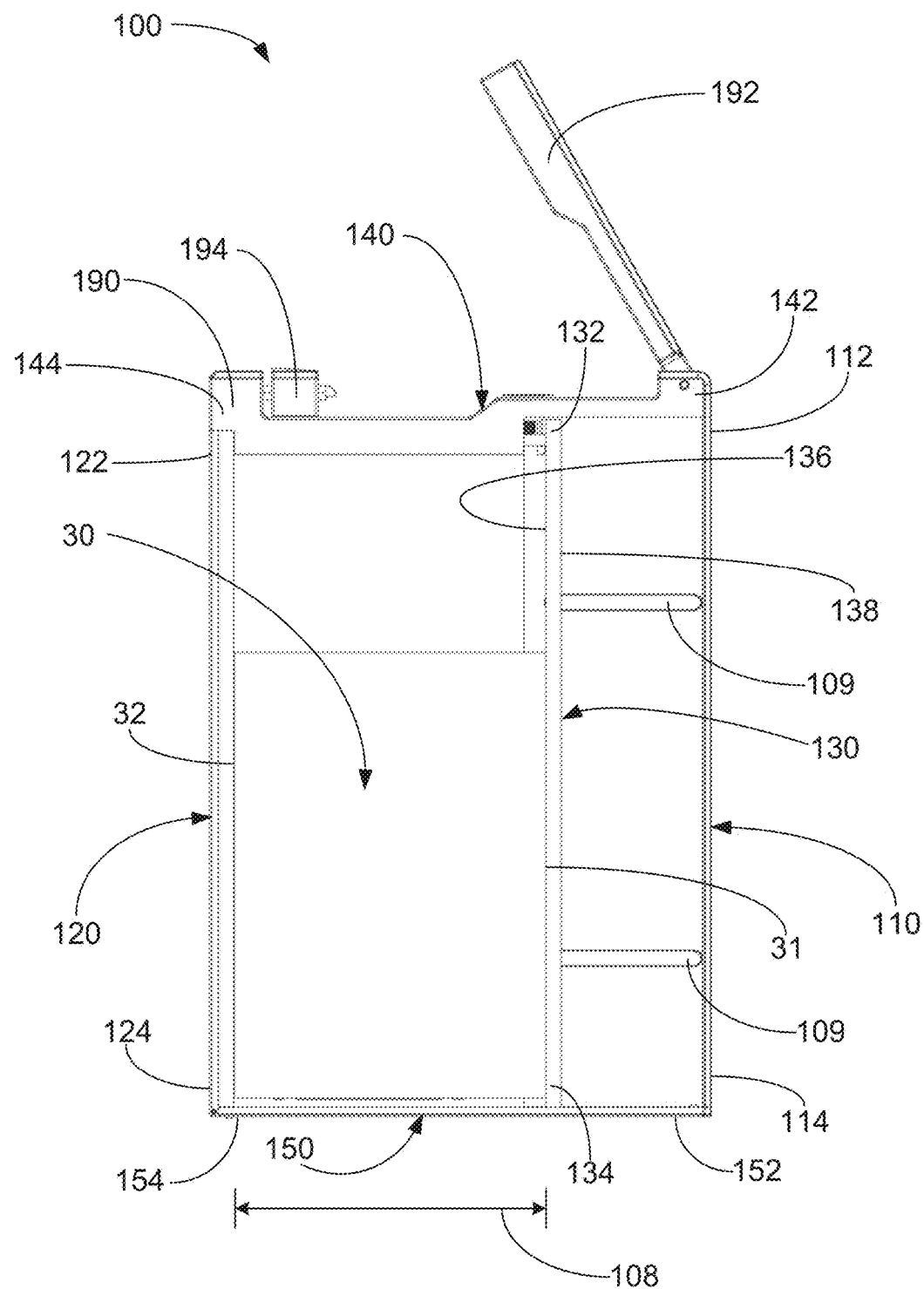
FIG. 3C is a top view of the carrier of FIG. 3A configured in the reduced configuration and the second device received thereby.
Figure 3D:
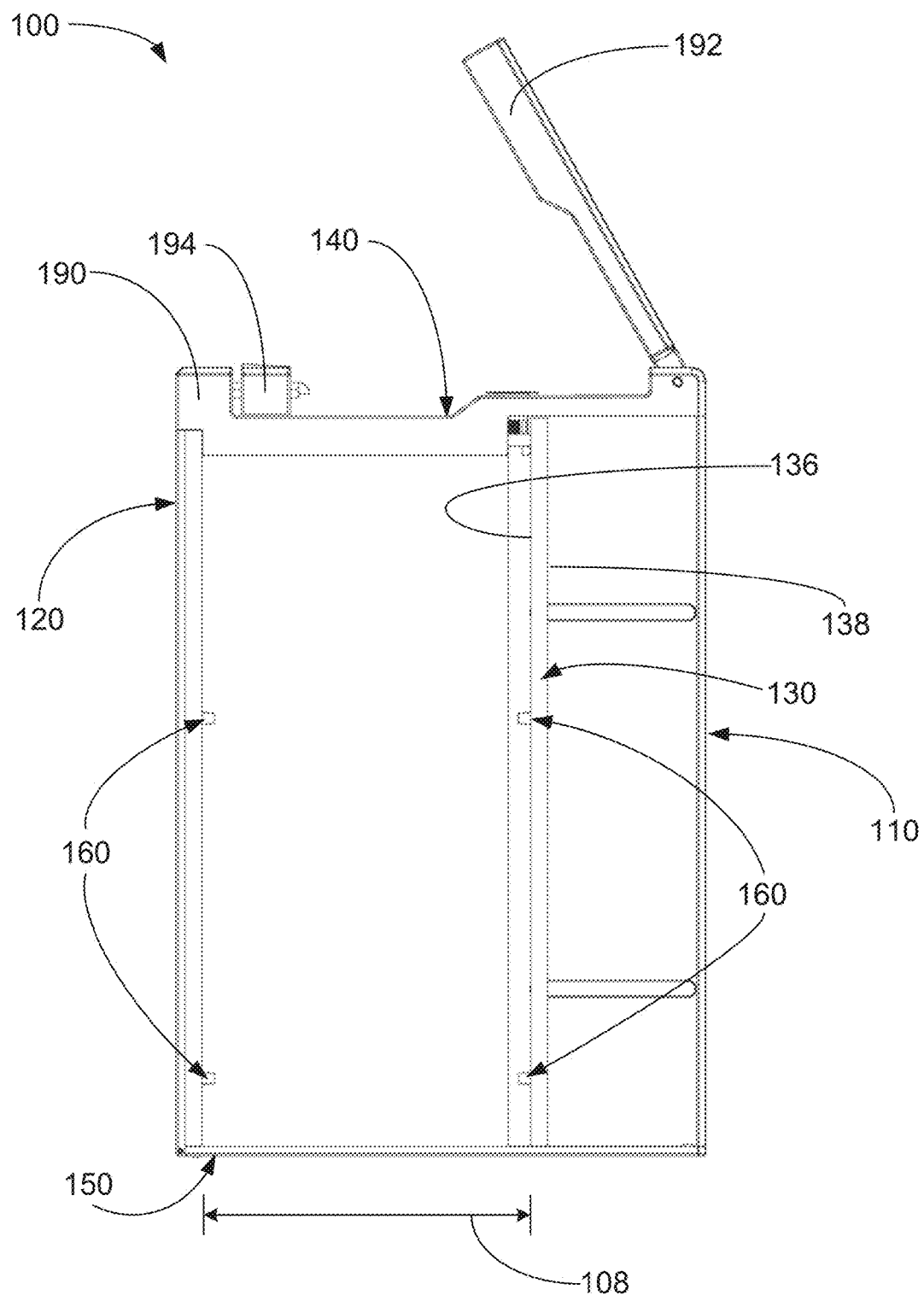
FIG. 3D is a top view of the carrier of FIG. 3A configured in the reduced configuration without the second device received thereby.
Figure 3E:
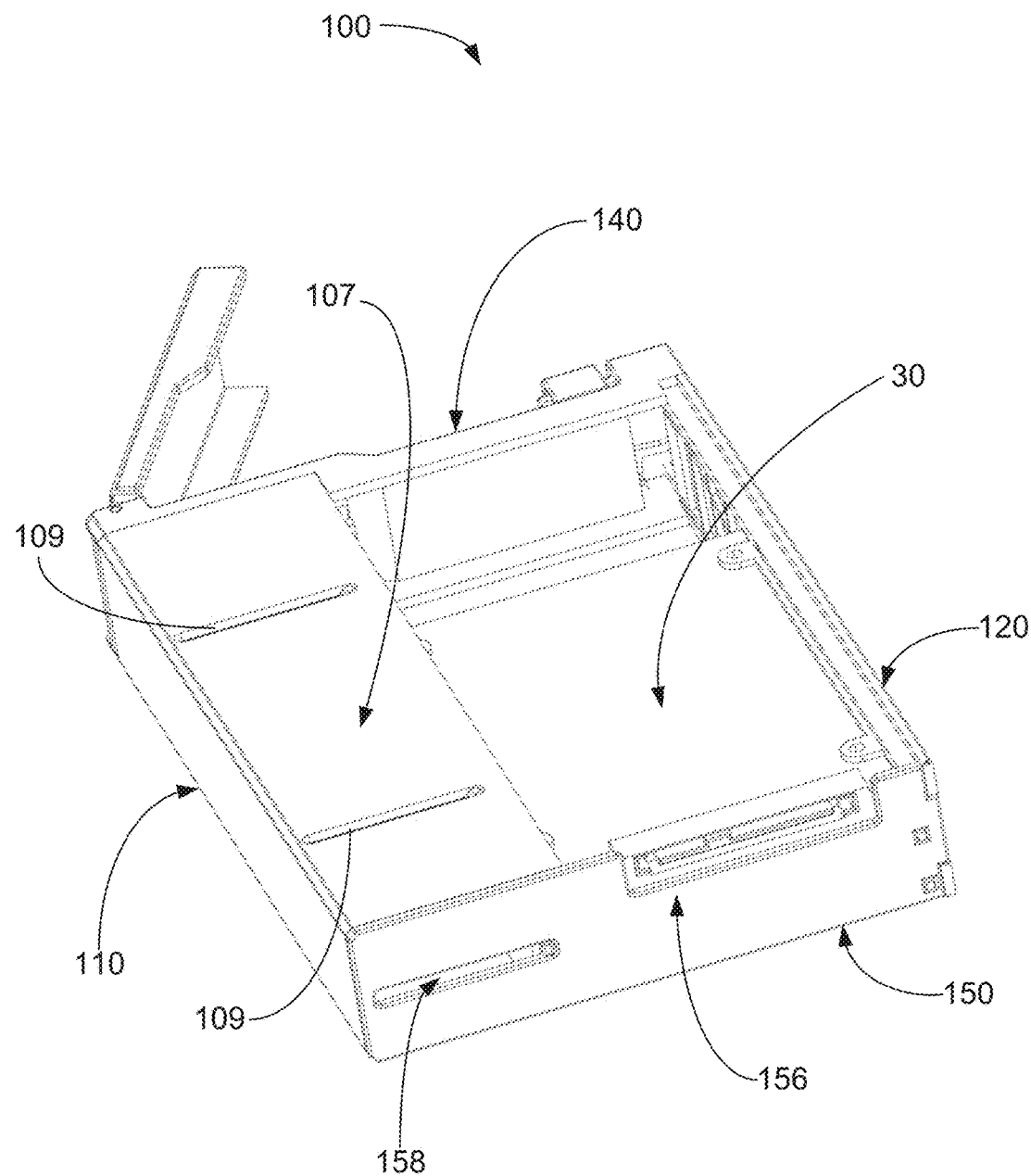
FIG. 3E is a bottom perspective view of the carrier of FIG. 3A configured in the reduced configuration and the second device received thereby.

The interface portion 150 of the carrier 100 may define an interface opening 156 between the first and second end regions 152, 154 of the interface portion 150, e.g., as shown in each of FIGS. 2B, 2E, 3B, and 3E. The interface opening 156 may provide an opening through which the interface of the device 12 may be operably coupled to an interface of the enclosure 10. For example, one or both of the interfaces of the device 12 and the enclosure 16 may extend at least partially into the interface opening 156 to facilitate the operable coupling therebetween. The interface opening 156 is located, and the carrier 100 is configurable, such that the interface of the LFF device (e.g., as shown in FIG. 2E) or the interface of the SFF device (e.g., as shown in FIG. 3E) is accessible through the interface opening 156.

The carrier 100 may also include a movable rail 130 extending between a forward end region (or portion) 132 and an interface end region (or portion) 134. The movable rail 130 may move between the first and second side rails 110, 120 (e.g., towards the first side rail 110 and away from the second side rail 120 or towards the second side rail 120 and away from the first side rail 110) to receive one of a plurality of varying-width devices 12 between the movable rail 130 and the second side rail 120. The movable rail 130 may move between the first and second side rails 110, 120 in any suitable way. For example, in some embodiments, the movable rail 130 may be linearly translatable between the first side rail 110 and the second side rail 120. Furthermore, in one or more embodiments, the movable rail 130 may extend parallel with, or to, both of the first and second side rails 110, 120 (and, e.g., parallel with the carrier axis 101) when the movable rail 130 moves between the first side rail 110 and the second side rail 120. In other words, the movable rail 130 may remain parallel with first and second side rails 110, 120 over its travel between the first and second side rails 110, 120. Furthermore, the movable rail 130 may define an outer surface 138 facing the first side rail 110 and an inner surface 136 (e.g., opposite the outer surface 138 of the movable rail 130) facing the second side rail 120.

The exemplary carrier 100 may be described as being adaptable or configurable in various ways to provide the functionality described herein. For example, the carrier 100 may be adapted, or configured, in at least an expanded configuration (e.g., as shown in FIGS. 2A-2E) to receive a first device 20 (e.g., a LFF device) and a reduced configuration (e.g., as shown in FIGS. 3A-3E) to receive a second device 30 (e.g., a SFF device) that is different than the first device 20. For example, the movable rail 130 may be moved to configure the carrier 100 into either the expanded configuration or the reduced configuration. In some embodiments, the movable rail 130 may abut, or be in contact with, the first side rail 110 when the movable rail 130 is in the expanded configuration and may be located between the first and second side rails 110, 120 when in the reduced configuration. The first and second devices 20, 30 may be different sizes such that the carrier 100 may be adjusted to specifically receive one of the first and second devices 20, 30. For example, the first device 20 may define a first width 106 between a first edge 21 and a second edge 22 and the second device 30 may define a second width 108 between a first edge 31 and a second edge 32. In one or more embodiments, the second width 108 may be less than the first width 106 (e.g., the second device 30 may be "smaller" than the first device 20).

The first and second widths 106, 108 of the first and second devices 20, 30 may correspond with a distance between the movable rail 130 and the second side rail 120 that receives the first and second devices 20, 30, respectively. For example, an expanded distance (e.g., the first width 106) may be measured between the inner surface 136 of the movable rail 130 and the second side rail 120 when the movable rail 130 is in the expanded configuration as illustrated in FIG. 2D. The expanded distance may be described as being sufficient (e.g., within a given tolerance) to allow the first device 20 to be received between the movable rail 130 and the second side rail 120. Also, for example, a reduced distance (e.g., the second width 108) may be measured between the inner surface 136 of the movable rail 130 and the second side rail 120 when the movable rail 130 is in the reduced configuration as illustrated in FIG. 3D. The reduced distance may be described as being sufficient (e.g., within a given tolerance) to allow the second device 30 to be received between the movable rail 130 and the second side rail 120. As such, the expanded distance is greater than the reduced distance.

As described herein, the movable rail 130 may be movable between the first and second side rails 110, 120 to configure the carrier between the expanded configuration and the reduced configuration. In other words, the exemplary systems described herein may include a single carrier, such as carrier 100, and a plurality of different sized devices (e.g., varying-width) to be received by the carrier. As such, the carrier may be modified or adjusted such that the carrier is appropriately sized to receive one of the plurality of different sized devices. It may be described that the exemplary system including a carrier and a plurality of different sized devices may be a "kit" to adapt the plurality of different sized devices to work with, or interface with, a plurality of different enclosures.

The movable rail 130 may be positioned in each of the expanded and reduced configurations to define an opening (e.g., expanded opening 25 as shown in FIG. 2B and reduced opening 35 as shown in FIG. 3B) to receive the first and second devices 20, 30, respectively (e.g., as shown in FIGS. 2A and 3A, respectively). For example, the movable rail 130 may be in the expanded configuration (e.g., as shown in FIGS. 2A-2E) such that the first device 20 may be positioned within the expanded opening 25 and connected to each of the movable rail 130 and the second side rail 120. Further, for example, the movable rail 130 may be in the reduced configuration (e.g., as shown in FIGS. 3A-3E) such that the second device 30 may be positioned within the reduced opening 35 and connected to each of the movable rail 130 and the second side rail 120.

In one or more embodiments, the movable rail 130 may be positioned such that the outer surface 138 of the movable rail 130 faces the first side rail 110 and the inner surface 136 of the movable rail 130 faces the second side rail 120 in both the expanded and reduced configurations. In other words, the movable rail 130 may not pivot or rotate when moving between the expanded and reduced configurations—and instead translate linearly. As such, in one or more embodiments, when the first device 20 is received by the expanded opening 25 of the carrier 100 (e.g., when in the expanded configuration), the inner surface 136 of the movable rail 130 may contact, or abut, the first edge 21 of the first device 20 (and the second side rail 120 may contact, or abut, the second edge 22 of the first device 20). Similarly, when the second device 30 is received by the reduced opening 35 of the carrier 100 (e.g., when in the reduced configuration), the inner surface 136 of the movable rail 130 may contact, or abut, the first edge 31 of the second device 30 (and the second side rail 120 may contact, or abut, the second edge 32 of the second device 30).

The movable rail 130 may move relative to the first and second side rails 110, 120 in a toolless manner. For example, the movable rail 130 may move or be adjusted without the use of additional tools or components (e.g., without the use of tools or components that are not connected or attached to the carrier 100). In other words, the parts needed to move the movable rail 130 may be integral or come with the carrier 100. Specifically, the movable rail 130 may move or be adjusted manually by a user, e.g., using his or her fingers.

Figure 5A:
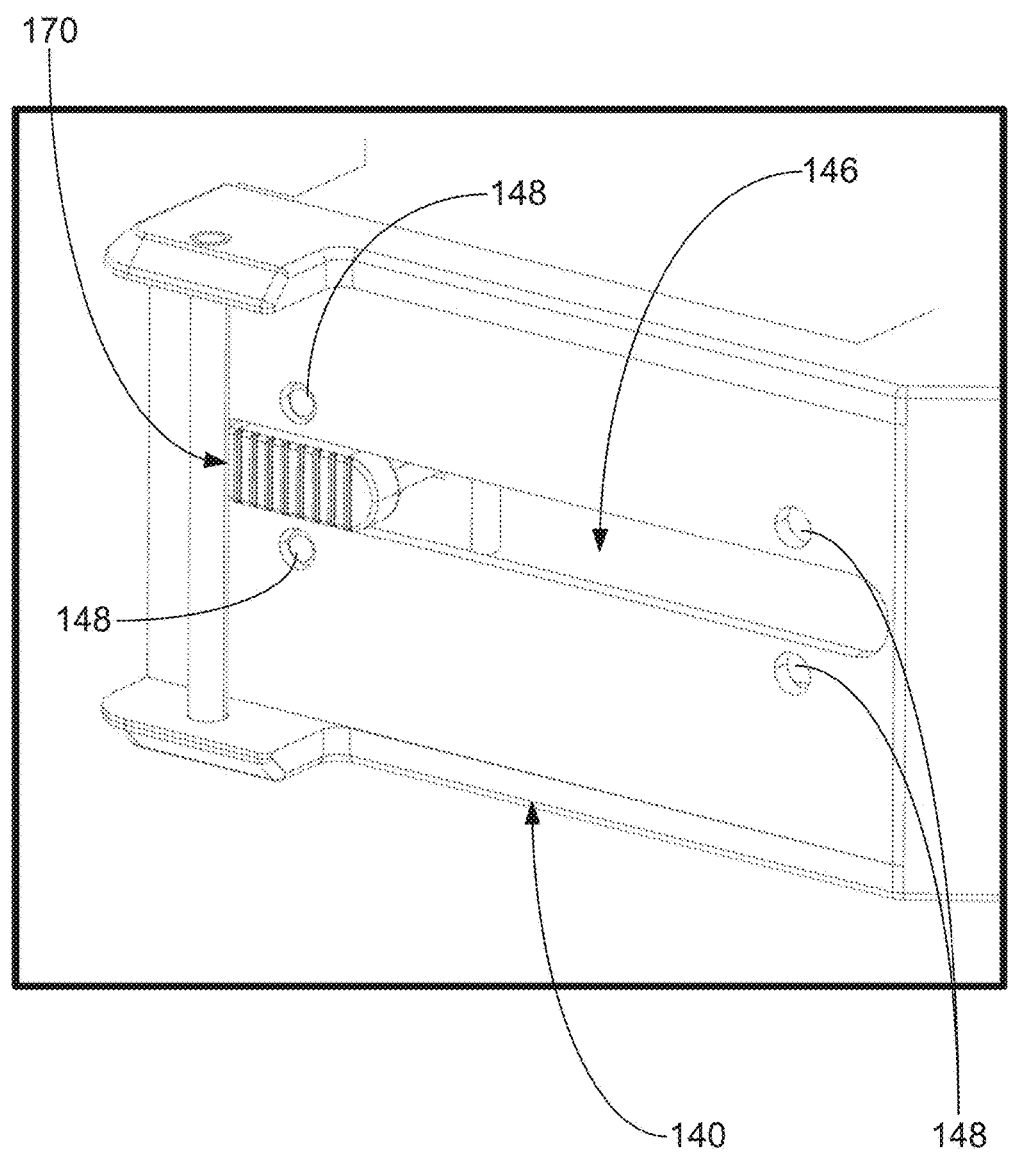
FIG. 5A is an expanded view of a slider apparatus of the carrier of FIG. 2A configured in the expanded configuration.
Figure 5B:
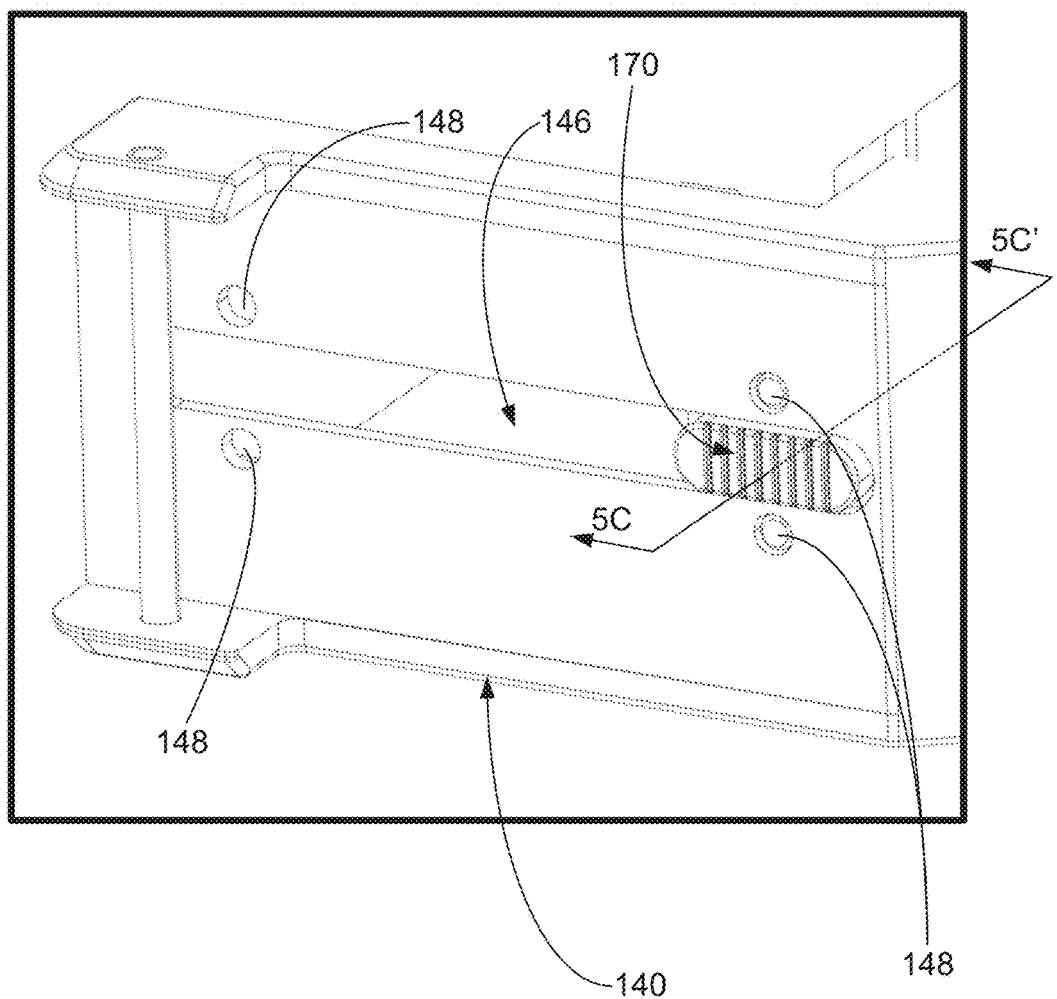
FIG. 5B is an expanded view of the slider apparatus of FIG. 5A configured in a reduced configuration.

The movable rail 130 may move relative to the first and second side rails 110, 120 in any suitable way. For example, the movable rail 130 may move along one or both of the forward portion 140 and the interface portion 150. In one or more embodiments, the movable rail 130 may maintain contact with at least one of the forward portion 140 and the interface portion 150 when moving between the first and second side rails 110, 120 (e.g., between the expanded and reduced configurations). For example, the forward portion 140 may define a forward groove 146, or slot, (e.g., as shown in FIGS. 5A-5B) that extends through the forward portion 140. The movable rail 130 may include a first protrusion 131 (e.g., a slider apparatus 170 as described further herein) proximate the forward end region 132 that is received by the forward groove 146 such that the movable rail 130 may move between the expanded and reduced configurations. Further, the interface portion 150 may include an interface groove 158, or slot, (e.g., as shown in FIG. 6B) that extends through the interface portion 150. The movable rail 130 may include a second protrusion 133 proximate the interface end region 134 that is received by the interface groove 158 such that the movable rail 130 may move between the expanded and reduced configurations. Further yet, the back portion 107 of the carrier 100 may define a back groove 109 (e.g., two back grooves illustrated in FIGS. 2-3) that receive a protrusion of the movable rail 130 to guide movable rail 130 as it moves between the expanded and reduced configurations. Each of the forward groove 146, interface groove 158, and the back groove 109 may be configured to assist in guiding the movement of the movable rail 130 to, e.g., ensure that the movable rail 130 moves evenly between the expanded and reduced configurations.

Figure 4:
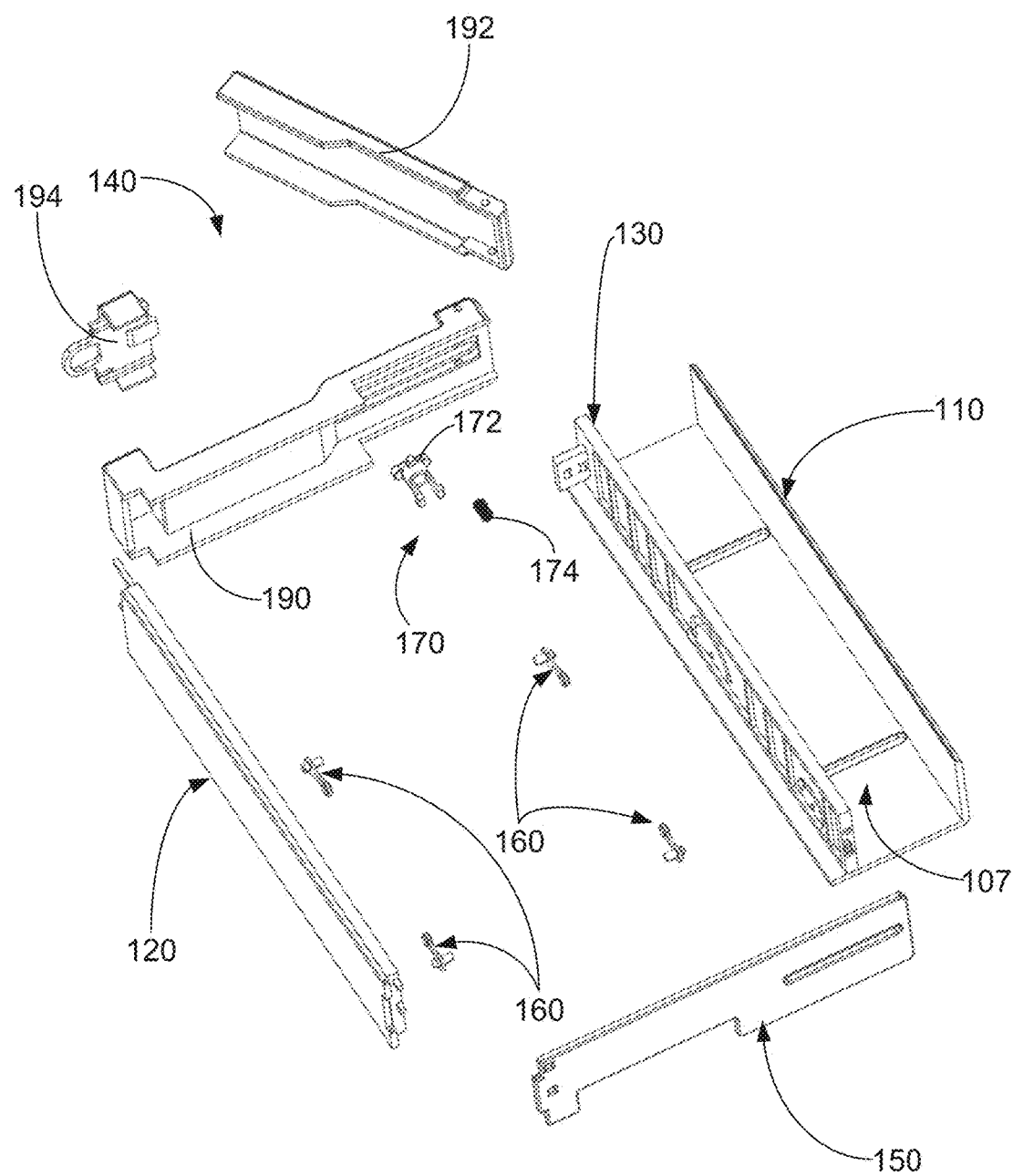
FIG. 4 is a perspective, exploded view of the carrier of FIGS. 2-3.

In one or more embodiments, the carrier 100 may include a slider apparatus 170 (e.g., as shown in an exploded view of the carrier 100 illustrated in FIG. 4) coupled to the movable rail 130 to move (e.g., when actuated by a user) the movable rail 130 between the expanded configuration and the reduced configuration (e.g., between the first and second side rail 110, 120). Specifically, the slider apparatus 170 may extend through at least a portion of the forward portion 140. For example, the first protrusion 131 of the movable rail 130, as described above, may be or be a part of the slider apparatus 170.

The slider apparatus 170 may be configurable between a locked position and an unlocked position. For example, the slider apparatus 170 may be restricted from movement transverse to the carrier axis 101 (and, thus, restricting movement of the movable rail 130) when in the locked position. Specifically, as shown in FIG. 5A, the slider apparatus 170 is in the locked position when the movable rail 130 is in the expanded configuration. Also, as shown in FIG. 5B, the slider apparatus 170 is in the locked position when the movable rail 130 is in the reduced configuration. The slider apparatus 170 may be free to move between the first side rail 110 and the second side rail 120 when in the unlocked position.

Figure 5C:
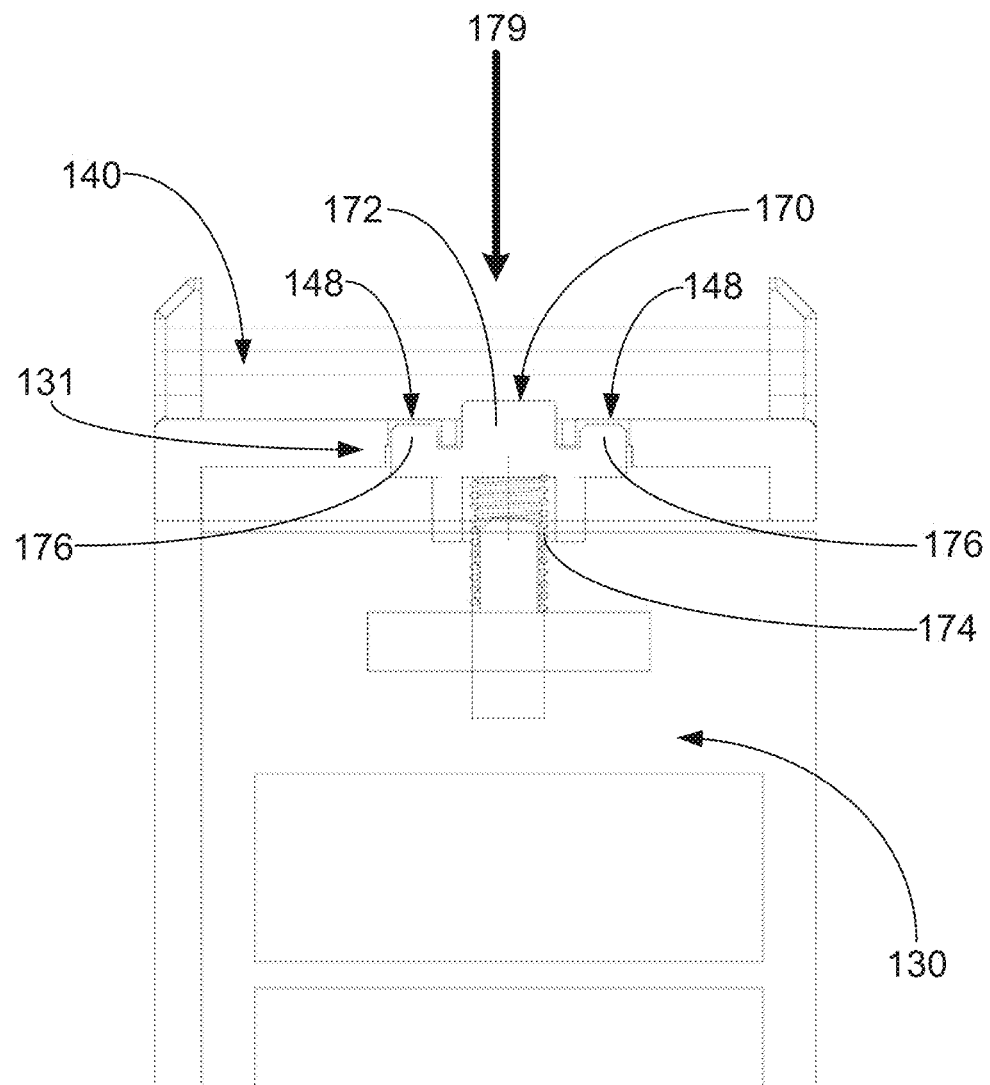
FIG. 5C is a cross-sectional view of the slider apparatus taken across line 5C-5C' of FIG. 5B.

Further, as shown in cross-sectional view of FIG. 5C, the slider apparatus 170 may include a slider body 172 and biasing member 174 (e.g., a spring) between the slider body 172 and the movable rail 130. The slider body 172 may extend through the forward portion 140 (e.g., through the forward groove 146). Additionally, the slider body 172 may include slider protrusions 176 that are configured to interact with recesses 148 located in the forward portion 140. For example, when the slider protrusions 176 are engaged with the recesses 148, the slider apparatus 170 may be restricted from moving in a direction transverse to the carrier axis 101 and, thereby, the slider apparatus 170 is in a locked position. The recesses 148 of the forward portion 140 may be positioned such that the slider apparatus 170 engages the recesses 148 to secure the movable rail 130 (e.g., the locked position) in either of the reduced configuration or the expanded configuration. Additionally, the recesses 148 may be located on either side of the forward groove 146. When in the locked position, the slider apparatus 170 may be actuated (e.g., by depressing or pressing the slider apparatus 170 in a direction parallel to the carrier axis 101 and towards the forward portion 140) to disengage the slider protrusions 176 from the recesses 148 of the forward portion 140 such that the slider apparatus 170 (and, thus, the movable rail 130) may move perpendicular to the carrier axis 101 (e.g., between the expanded and reduced configurations). For example, a force may be applied in direction 179 to compress the biasing member 174 to disengage the slider protrusions 176 from the recesses 148.

In one or more embodiments, the forward portion 140 may include a forward body member 190 extending between the first and second side rails 110, 120 and a forward cover member 192 pivotally coupled to the forward body member 190 as shown in FIGS. 2A and 3A. Further, the forward portion 140 may include a latch 194 configured to couple an end of the forward cover member 192 (e.g., the end not pivotally coupled to the forward body member 190) to the forward body member 190. The forward cover member 192 may pivot relative to the forward body member 190 to enclose (e.g., cover or protect) the slider apparatus 170 and to make accessible (e.g., uncover) the slider apparatus 170 such that the slider apparatus 170 may be actuated to move the movable rail 130.

In one or more embodiments, the carrier 100 may also include at least one locating member 160 attached to one or both of the movable rail 130 and the second side rail 120 to position and secure the device 12 (e.g., the first device 20 or the second device 30) within the carrier 100. Each of the devices 12 may include attachment points that are different than each other. Therefore, the at least one locating member 160 may assist in positioning the device 12 (e.g., regardless of the size of the device) relative to the interface end region 104 such that the interface of the device 12 is positioned in a known location (e.g., relative to the interface opening 156 of the interface portion 150). The at least one locating member 160 may take any suitable form (e.g., pivoting, rotating, sliding, translating) that may be adjusted depending on the size of the device 12 and may be configured to couple the device 12 within the carrier 100.

Further, the carrier 100 may include any number of locating members 160. For example, as shown the carrier 100 includes two locating members 160 pivotally attached to the movable rail 130 and two locating members 160 pivotally attached to the second side rail 120 (e.g., pivoting along a groove in either of the movable rail 130 or the second side rail 120). It is noted that the locating members 160 attached to the moveable rail 130 and illustrated in FIGS. 7A and 7B will be used to describe the locating members 160, but the locating members 160 attached to the second side rail 120 (e.g., shown proximate the second side rail 120 in FIG. 4) are mirror images of those illustrated in FIGS. 7A and 7B.

Each of the locating members 160 may include a pivot portion 162 about which the locating member 160 is pivotally coupled to the movable rail 130 or the second side rail 120. Each of the locating members 160 may also include a lever portion 164 extending from the pivot portion 162 and a peg portion 166 extending from the lever portion 164 at a distance from the pivot portion 162 along the lever portion 164 (e.g., at an end of the lever portion 164 opposite the pivot portion 162). The peg portion 166 may be configured to be coupled to, or inserted within, the device 12 (e.g., within an aperture in the device 12) to toollessly connect the device 12 within the carrier 100. The locating members 160 may be pivoted between a first position (e.g., as shown in FIG. 7A) and a second position (e.g., as shown in FIG. 7B) to accommodate for the differing sizes of devices 12.

Figure 7A:
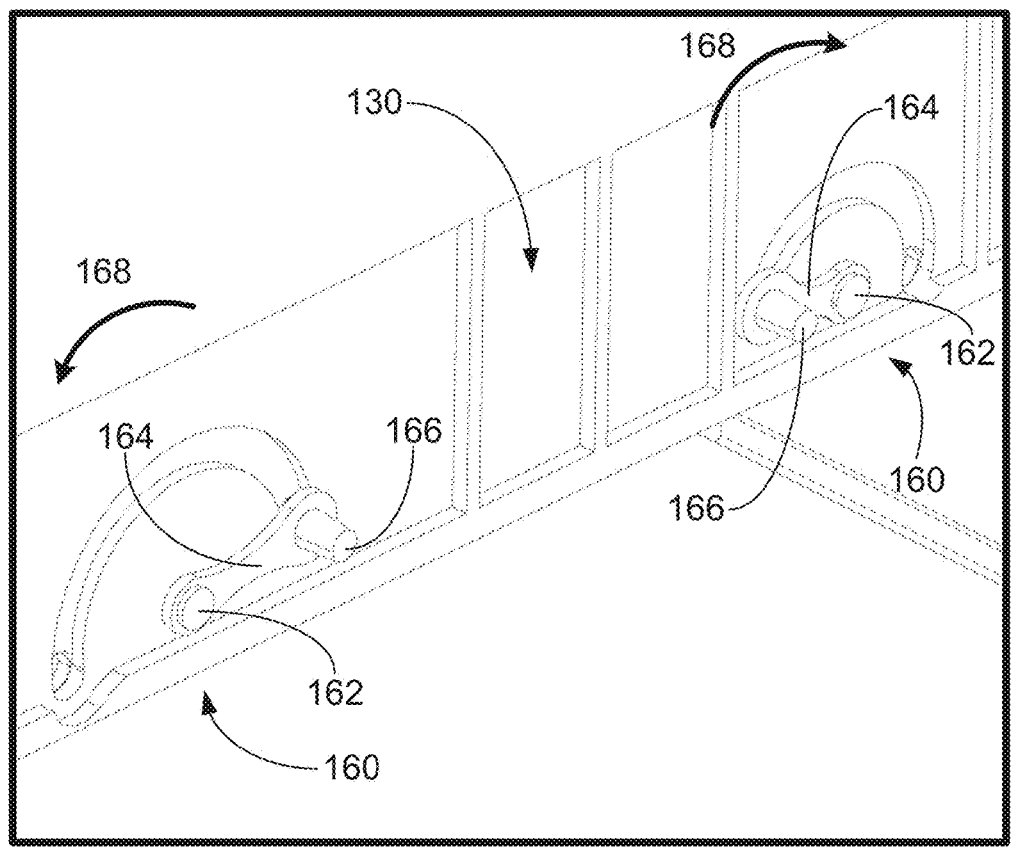
FIG. 7A is an expanded view of at least one locating member of the carrier of FIG. 2A configured in the expanded configuration.

For example, the locating members 160 may be configured to be positioned in the first position (e.g., as shown in FIG. 7A) to receive the first device 20 such that the interface of the first device 20 is proximate the interface end region 104 (e.g., proximate the interface end region 134 of the movable rail 130). As shown in FIG. 7A, the locating members 160 are pivoted in a position closest to one another such that the peg portion 166 of each locating member 160 may be coupled to the first device 20. The locating member 160 may rotate in directions 168 to move from the first position to the second position.

Figure 7B:
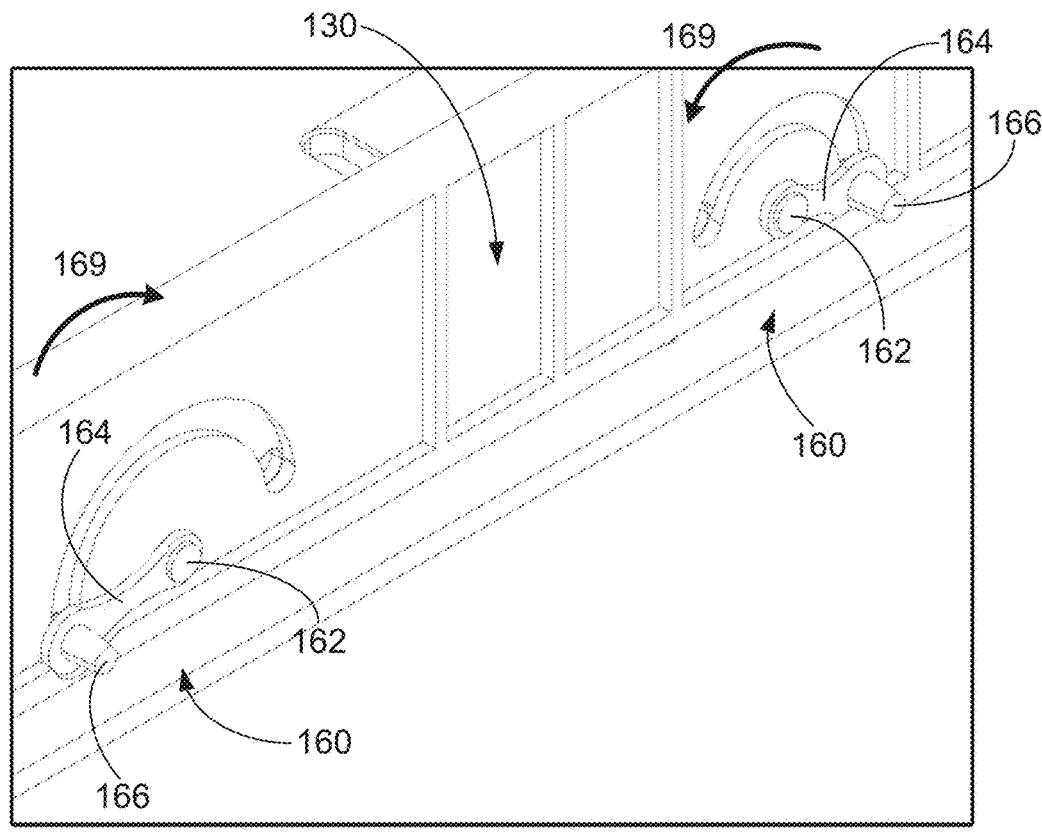
FIG. 7B is an expanded view of at least one locating member of the carrier of FIG. 3A configured in the reduced configuration.

The locating members 160 may also be configured to be positioned in the second position (e.g., as shown in FIG. 7B) to receive the second device 30 such that the interface of the second device 30 is proximate the interface end region 104 (e.g., proximate the interface end region 134 of the movable rail 130). As shown in FIG. 7B, the locating members 160 are pivoted in a position farthest away from one another such that the peg portion 166 of each locating member 160 may be coupled to the second device 30. The locating member 160 may rotate in directions 169 to move from the second position to the first position.

The locating member 160 may be pivotally coupled to the movable rail 130 and the second side rail 120, separately, in a toolless manner. For example, the locating member may move or be adjusted without the use of additional tools or components (e.g., without the use of tools or components that are not connected or attached to the carrier 100). Specifically, the locating member 160 may move or be adjusted manually by a user, e.g., using his or her fingers. Further, the movable rail 130 or second side rail 120 for which the locating member 160 is pivotally attached may also define an aperture through the corresponding movable rail 130 or second side rail 120 such that the locating member 160 may be temporarily fixed in the first position or second position. For example, the locating member 160 may be movable towards the rail, for which it is pivotally attached, such that a portion of the locating member 160 restricts the locating member 160 from pivoting relative to the movable rail 130 or the second side rail 120. Further, the locating member 160 may be forced away from the rail (e.g., without removing the locating member 160 from the corresponding rail), for which it is pivotally attached, such that the locating member 160 may pivot relative to the movable rail 130 or the second side rail 120.

Figure 6A:
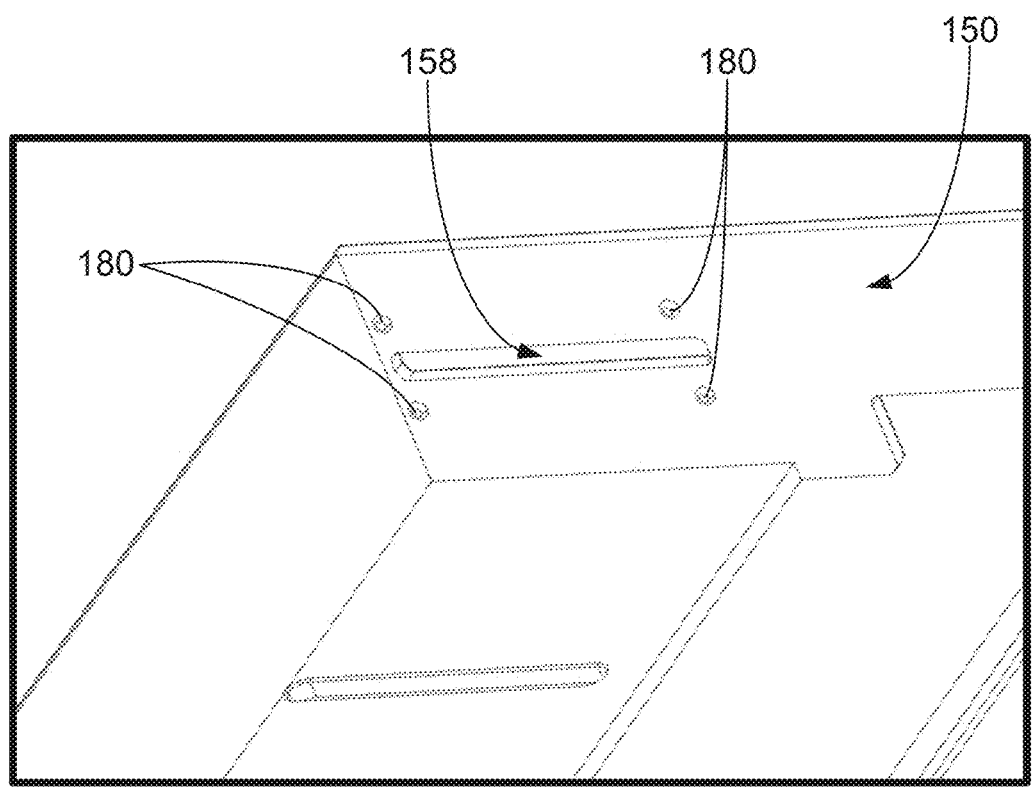
FIG. 6A is an expanded view of a restriction element of the carrier of FIGS. 2-3 without a movable rail.
Figure 6B:
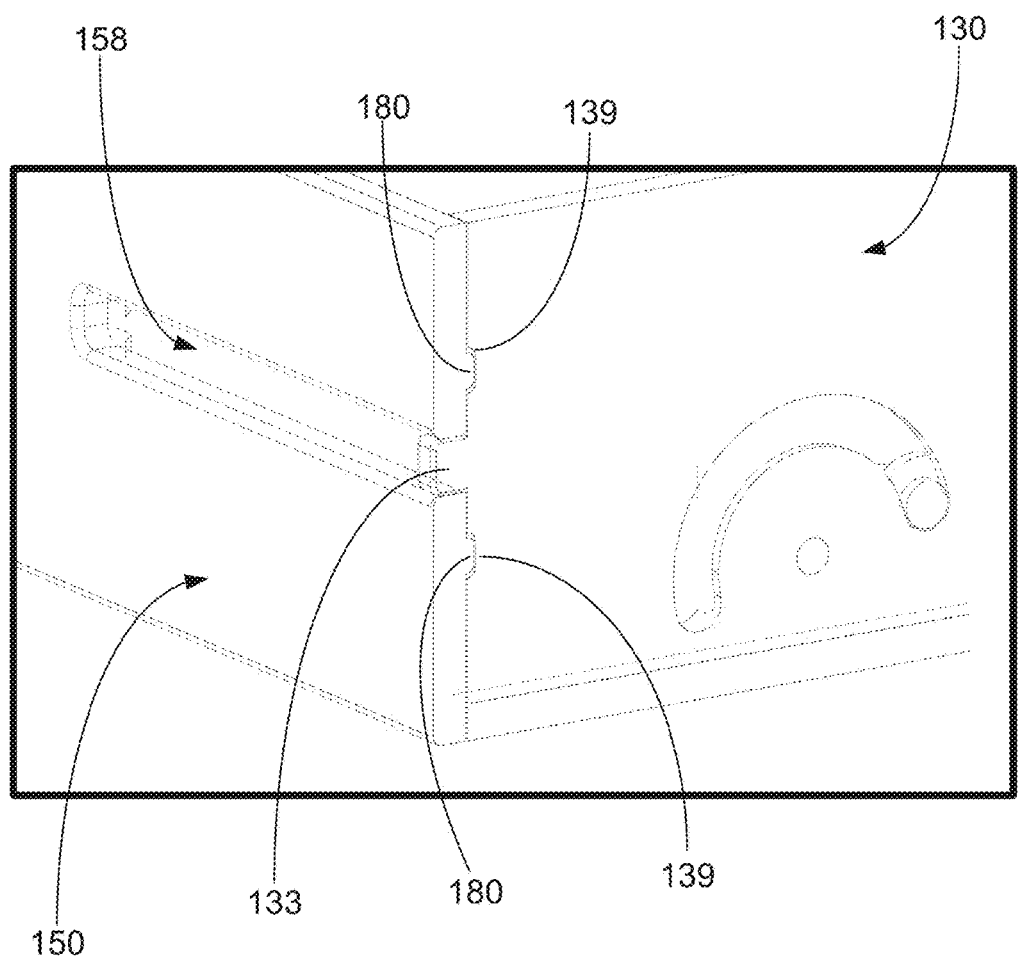
FIG. 6B is an expanded cross-sectional view of the restriction element of FIG. 6A with the movable rail.

The carrier 100 may also include restriction elements 180, as shown in FIGS. 6A and 6B, configured to assist in restricting the movement of the movable rail 130 in at least one of the reduced configuration and the expanded configuration. For example, at least one of the forward portion 140 and the interface portion 150 may include the restriction elements 180. As shown in FIG. 6A, the interface portion 150 includes four restriction elements 180 on either side of the interface groove 158. Two restrictions elements 180 (e.g., as shown on the left in FIG. 6A) correspond to the expanded configuration and two restriction elements 180 (e.g., as shown on the right in FIG. 6A) correspond to the reduced configuration. The restriction elements 180 may interact with the movement of the movable rail 130 to assist in holding the movable rail 130 in position at the expanded configuration and the reduced configuration, but do not completely prevent the movable rail 130 from moving. For example, the restriction elements 180 may provide an interference fit with the movable rail 130. Also, as shown in FIG. 6B, the movable rail 130 defines indents 139 to interact with the restriction elements 180.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise. As used herein, "or" is generally employed in its sense including "and/or" unless the content clearly dictates otherwise. As used herein, "have," "having," "include," "including," "comprise," "comprising," or the like are used in their open-ended sense, and generally mean "including, but not limited to."

Embodiments of the systems, carriers, and carrier apparatus are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A carrier comprising:
   a first side rail and a second side rail spaced apart from the first side rail, each of the first and second side rails extending between a forward end region and an interface end region;
   a movable rail extending between the forward end region and the interface end region, the movable rail linearly translatable between the first and second side rails to receive one of a plurality of varying-width devices between the movable rail and the second side rail;
   a forward portion extending between a first end region and a second end region, wherein the first end region of the forward portion is connected to the forward end region of the first side rail and the second end region of the forward portion is connected to the forward end region of the second side rail; and
   an interface portion extending between a first end region and a second end region, wherein the first end region of the interface portion is connected to the interface end region of the first side rail and the second end region of the interface portion is connected to the interface end region of the second side rail,
   wherein the movable rail maintains contact with at least one of the forward portion and the interface portion when moving between the first and second side rails.

2. The carrier of claim 1, further comprising at least one locating member movably attached to the movable rail to position the one of the plurality of varying-width devices, wherein the at least one locating member is positionable at a first position to receive a first device of the plurality of varying-width devices such that an interface of the first device is proximate the interface end region of the movable rail, and wherein the at least one locating member is positionable at a second position to receive a second device of the plurality of varying-width devices such that an interface of the second device is proximate the interface end region of the movable rail.

3. The carrier of claim 1, further comprising:
   a forward portion extending between a first end region and a second end region, wherein the first end region of the forward portion is connected to the forward end region of the first side rail and the second end region of the forward portion is connected to the forward end region of the second side rail; and
   a slider apparatus coupled to the movable rail and extending through at least a portion of the forward portion, wherein the slider apparatus, when actuated by a user, allows the movable rail to be moved between the first and second side rails.

4. The carrier of claim 3, wherein the slider apparatus is configurable between a locked position and an unlocked position, wherein the movable rail moves between the first side rail and the second side rail when the slider apparatus is in the unlocked position and the movable rail is restricted from movement when the slider apparatus is in the locked position.

5. The carrier of claim 1, wherein the movable rail extends parallel with both of the first and second side rails when the movable rail moves between the first side rail and the second side rail.

6. An apparatus comprising:
   a first side rail extending between a forward end region and an interface end region;
   a second side rail extending between the forward end region and the interface end region;
   a movable rail extending between the forward end region and interface end region and positioned between the first and second side rail, the movable rail movable between an expanded configuration to receive a first device and a reduced configuration to receive a second device that is different than the first device, the movable rail defining an outer surface facing the first side rail and an opposite inner surface facing the second side rail in both the expanded and reduced configurations, an expanded distance measured between the inner surface of the movable rail and the second side rail when the movable rail is in the expanded configuration is greater than a reduced distance measured between the inner surface of the movable rail and the second side rail when the movable rail is in the reduced configuration; and
   an interface portion extending between a first end region and a second end region, wherein the first end region of the interface portion is connected to the interface end region of the first side rail and the second end region of the interface portion is connected to the interface end region of the second side rail,
   wherein the interface portion defines an interface groove that receives a second end protrusion of the movable rail.

7. The apparatus of claim 6, further comprising:
a forward portion extending between a first end region and a second end region, wherein the first end region of the forward portion is connected to the forward end region of the first side rail and the second end region of the forward portion is connected to the forward end region of the second side rail,
wherein the movable rail maintains contact with at least one of the forward and interface portions when moving between the reduced and extended configurations.

8. The apparatus of claim 7, wherein at least one of the forward portion and the interface portion comprises a restriction element configured to restrict motion of the movable rail in at least one of the reduced configuration and the expanded configuration.

9. The apparatus of claim 6, further comprising at least one locating member movably attached to the movable rail to position at least one of the first and second devices, wherein the at least one locating member is positionable at a first position when the movable rail is in the expanded configuration such that an interface of the first device is proximate the interface end region of the movable rail, and wherein the at least one locating member is positionable at a second position when the movable rail is in the reduced configuration such that an interface of the second device is proximate the interface end region of the movable rail.

10. The apparatus of claim 6, further comprising:
a forward portion extending between a first end region and a second end region, wherein the first end region of the forward portion is connected to the forward end region of the first side rail and the second end region of the forward portion is connected to the forward end region of the second side rail; and
a slider apparatus coupled to the movable rail and extending through at least a portion of the forward portion, wherein the slider apparatus, when actuated by a user, allows the movable rail to be moved between the reduced configuration and the expanded configuration.

11. The apparatus of claim 10, wherein the slider apparatus is configurable between a locked position and an unlocked position, wherein the movable rail moves between the reduced configuration and the expanded configuration when the slider apparatus is in the unlocked position and the movable rail is restricted to either of the reduced configuration or the expanded configuration when the slider apparatus is in the locked position.

12. The apparatus of claim 6, wherein the movable rail abuts the first side rail when in the expanded configuration.

13. A system comprising:
a first side rail extending between a forward end region and an interface end region;
a second side rail extending between the forward end region and the interface end region;
a movable rail extending between the forward end region and the interface end region and positioned between the first side rail and the second side rail to receive one of a first device and a second device, the first device defining a first width between a first edge and a second edge and the second device defining a second width between a first edge and a second edge that is less than the first width, the movable rail defining an outer surface facing the first side rail and an opposite inner surface facing the second side rail, the movable rail movable between an expanded configuration defining an expanded opening to receive the first device such that the inner surface of the movable rail abuts the first edge of the first device and a reduced configuration defining a reduced opening to receive the second device such that the inner surface of the movable rail abuts the first edge of the second device; and
at least one locating member pivotally attached to the movable rail to position at least one of the first and second devices, wherein the at least one locating member is configured to be positioned at a first position when the movable rail is in the expanded configuration such that an interface of the first device is proximate the interface end region of the movable rail, and wherein the at least one locating member is configured to be positioned at a second position when the movable rail is in the reduced configuration such that an interface of the second device is proximate the interface end region of the movable rail.

14. The system of claim 13, further comprising:
a forward portion extending between a first end region and a second end region, wherein the first end region of the forward portion is connected to the forward end region of the first side rail and the second end region of the forward portion is connected to the forward end region of the second side rail; and
an interface portion extending between a first end region and a second end region, wherein the first end region of the interface portion is connected to the interface end region of the first side rail and the second end region of the interface portion is connected to the interface end region of the second side rail,
wherein the movable rail maintains contact with at least one of the forward and interface portions when moving between the reduced and extended configurations.

15. The system of claim 13, further comprising:
a forward portion extending between a first end region and a second end region, wherein the first end region of the forward portion is connected to the forward end region of the first side rail and the second end region of the forward portion is connected to the forward end region of the second side rail; and
a slider apparatus coupled to the movable rail and extending through at least a portion of the forward portion, wherein the slider apparatus, when actuated by a user, allows the movable rail to be moved between the reduced configuration and the expanded configuration.

16. The system of claim 15, wherein the slider apparatus is configurable between a locked position and an unlocked position, wherein the movable rail moves between the reduced configuration and the expanded configuration when the slider apparatus is in the unlocked position and the movable rail is restricted to either of the reduced configuration or the expanded configuration when the slider apparatus is in the locked position.

17. The system of claim 13, wherein the movable rail moves linearly between the reduced configuration and the expanded configuration.

* * * * *